(12) United States Patent
Okada et al.

(10) Patent No.: US 11,417,854 B2
(45) Date of Patent: Aug. 16, 2022

(54) LIGHT-EMITTING DEVICE AND LIGHT-EMITTING MODULE

(71) Applicant: PIONEER CORPORATION, Tokyo (JP)

(72) Inventors: Takeru Okada, Tokyo (JP); Chihiro Harada, Tokyo (JP); Ayako Yoshida, Tokyo (JP); Takashi Chuman, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/757,738

(22) PCT Filed: Oct. 19, 2018

(86) PCT No.: PCT/JP2018/038918
§ 371 (c)(1),
(2) Date: Apr. 20, 2020

(87) PCT Pub. No.: WO2019/078318
PCT Pub. Date: Apr. 25, 2019

(65) Prior Publication Data
US 2021/0242421 A1    Aug. 5, 2021

(30) Foreign Application Priority Data
Oct. 20, 2017   (JP) .............................. JP2017-203218

(51) Int. Cl.
*H01L 51/52*    (2006.01)
(52) U.S. Cl.
CPC ...... *H01L 51/5209* (2013.01); *H01L 51/5225* (2013.01)

(58) Field of Classification Search
CPC ........................ H01L 51/5209; H01L 51/5225
See application file for complete search history.

(56) References Cited

U.S. PATENT DOCUMENTS 6,791,260 B2 *  9/2004  Komatsu ............. H01L 27/3281
                                                 313/504
6,965,363 B2 * 11/2005  Sato ..................... G09G 3/3225
                                                 345/82

(Continued)

FOREIGN PATENT DOCUMENTS

JP    2002133915 A    5/2002
JP    2005190768 A    7/2005

(Continued)

OTHER PUBLICATIONS

International Search Report for related Int. App. No. PCT/JP2018/038918 dated Jan. 15, 2019; 2 pages.

(Continued)

*Primary Examiner* — Bitew A Dinke
(74) *Attorney, Agent, or Firm* — Procopio, Cory, Hargreaves & Savitch LLP

(57) ABSTRACT

A plurality of light-emitting devices (10) include a plurality of light-emitting devices (10a), a plurality of light-emitting devices (10b), and a plurality of light-emitting devices (10c). The plurality of light-emitting devices (10) are aligned on a reflecting member (20). Six light-emitting devices (10c) are aligned in a straight line along one direction. Four light-emitting devices (10b) are aligned surrounding a region facing one ends of the six light-emitting devices (10c). Each of four light-emitting devices (10a) are aligned with each of the four light-emitting devices (10b) outside the four light-emitting devices (10b).

18 Claims, 19 Drawing Sheets

(56) References Cited

U.S. PATENT DOCUMENTS

| | | | |
|---|---|---|---|
| 7,501,754 B2* | 3/2009 | Funamoto | H01L 27/3246 |
| | | | 313/504 |
| 7,604,363 B2 | 10/2009 | Tanigawa et al. | |
| 8,022,623 B2 | 9/2011 | Rogojevic et al. | |
| 8,927,307 B2* | 1/2015 | Takahashi | H05B 33/26 |
| | | | 438/29 |
| 8,960,979 B2 | 2/2015 | Sanchez et al. | |
| 9,543,533 B2 | 1/2017 | Yamazaki et al. | |
| 10,096,669 B2 | 10/2018 | Yamazaki et al. | |
| 10,151,441 B2 | 12/2018 | Ito et al. | |
| 10,156,744 B2 | 12/2018 | Andou et al. | |
| 10,263,063 B2 | 4/2019 | Yamazaki et al. | |
| 10,437,377 B2 | 10/2019 | Akimoto | |
| 2001/0053082 A1 | 12/2001 | Chipalkatti et al. | |
| 2005/0140278 A1 | 6/2005 | Kato | |
| 2007/0159096 A1* | 7/2007 | Oh | H01L 27/3223 |
| | | | 313/512 |
| 2008/0151564 A1 | 6/2008 | Tanigawa et al. | |
| 2009/0322215 A1* | 12/2009 | Sung | H01L 27/3211 |
| | | | 313/504 |
| 2010/0039023 A1 | 2/2010 | Rogojevic et al. | |
| 2011/0102413 A1* | 5/2011 | Hamer | H01L 51/5221 |
| | | | 345/213 |
| 2011/0157575 A1* | 6/2011 | Lee | B05C 21/005 |
| | | | 355/72 |
| 2013/0027959 A1 | 1/2013 | Sanchez et al. | |
| 2014/0131671 A1* | 5/2014 | Lee | H01L 51/0003 |
| | | | 257/40 |
| 2014/0254111 A1 | 9/2014 | Yamazaki et al. | |
| 2015/0144929 A1* | 5/2015 | Minami | G09G 3/2074 |
| | | | 257/40 |
| 2015/0364523 A1* | 12/2015 | Sato | H01L 51/5203 |
| | | | 257/13 |
| 2015/0380471 A1* | 12/2015 | Guo | G09G 3/20 |
| | | | 345/76 |
| 2016/0102833 A1 | 4/2016 | Ito et al. | |
| 2016/0155396 A1* | 6/2016 | Yang | G09G 3/3648 |
| | | | 345/87 |
| 2016/0285043 A1* | 9/2016 | Lee | H01L 51/5253 |
| 2017/0077211 A1 | 3/2017 | Yamazaki et al. | |
| 2017/0084676 A1* | 3/2017 | Jang | H01L 51/5225 |
| 2017/0097535 A1 | 4/2017 | Andou et al. | |
| 2017/0139526 A1* | 5/2017 | Akimoto | H01L 27/323 |
| 2017/0191634 A1 | 7/2017 | Na et al. | |
| 2017/0212623 A1* | 7/2017 | Park | G02F 1/134336 |
| 2017/0338296 A1 | 11/2017 | Yamazaki et al. | |
| 2018/0033832 A1* | 2/2018 | Park | G06F 3/04164 |
| 2018/0267656 A1* | 9/2018 | Moon | G06F 3/04164 |
| 2018/0301644 A1* | 10/2018 | Ito | H01L 51/5284 |
| 2019/0115417 A1 | 4/2019 | Yamazaki et al. | |

FOREIGN PATENT DOCUMENTS

| | | |
|---|---|---|
| JP | 2008158150 A | 7/2008 |
| JP | 2012500453 A | 1/2012 |
| JP | 2013519971 A | 5/2013 |
| JP | 2015215995 A | 12/2015 |
| JP | 2016171055 A | 9/2016 |
| JP | 2016225209 A | 12/2016 |
| JP | 2017058694 A | 3/2017 |
| JP | 2017072668 A | 4/2017 |
| JP | 2017097400 A | 6/2017 |
| WO | 2010019347 A1 | 2/2010 |
| WO | 2012/005158 A1 | 1/2012 |

OTHER PUBLICATIONS

Extended European Search Report dated Jun. 11, 2021 from corresponding European Patent Application No. 18868955.8, 8 pages.

* cited by examiner

LIGHT-EMITTING DEVICE AND LIGHT-EMITTING MODULE

CROSS-REFERENCE TO RELATED APPLICATIONS

This application is a U.S. National Stage entry of PCT Application No. PCT/JP2018/038918, filed on Oct. 19, 2018, which claims priority to JP Application No. JP 2017-203218, filed Oct. 20, 2017, the contents of the foregoing are incorporated by reference.

TECHNICAL FIELD

The present invention relates to a light-emitting device and a light-emitting module.

BACKGROUND ART

In recent years, there has been developments in various light-emitting devices, and particularly, flexible light-emitting devices have been developed. A flexible light-emitting device includes a flexible substrate. Due to flexibility of the substrate, the light-emitting device is flexible. A light-emitting module can be configured by combining the light-emitting device with another member (for example, another light-emitting device, a structure to install a light-emitting device thereon, or a structure to supply electricity to the light-emitting device).

Patent Documents 1 and 2 describe examples of flexible light-emitting panels. The shape of a light-emitting panel is a rectangle having a pair of long sides in one direction. The light-emitting panel is curved along the one direction.

Patent Document 3 describes an example of a flexible display device. The display device includes a first display portion and a second display portion. The light-emitting device is flexible so that the first display portion and the second display portion are oriented in directions which are different from each other.

RELATED ART DOCUMENTS

Patent Document

[Patent Document 1]: Japanese Unexamined Patent Application Publication No. 2016-225209
[Patent Document 2]: Japanese Unexamined Patent Application Publication No. 2017-58694
[Patent Document 3]: Japanese Unexamined Patent Application Publication No. 2017-72668

SUMMARY OF THE INVENTION

The inventors have considered a light-emitting device and a light-emitting module having a novel structure.

An example of the problem to be solved by the present invention is to provide a light-emitting device and a light-emitting module having a novel structure.

Means for Solving the Problem

The invention described in claim 1 is a light-emitting device including:
a first electrode located on a first surface of a substrate;
an organic layer located on the first electrode;
second electrodes of a first group located on the organic layer and extending in a first direction; and
second electrodes of a second group located on the organic layer and extending in a second direction intersecting the first direction,
in which the first surface includes a first region in which the second electrodes of the first group are located, a second region in which the second electrodes of the second group are located, and a third region located between the first region and the second region in which no second electrode is located.

The invention described in claim 8 is a light-emitting device including:
a first electrode located on a first surface of a substrate;
an organic layer located on the first electrode;
second electrodes of a first group located on the organic layer and extending in a first direction; and
second electrodes of a second group located on the organic layer and extending in a second direction intersecting the first direction,
in which at least one of the second electrodes of the first group does not intersect any of the second electrodes of the second group.

The invention described in claim 10 is a light-emitting module including:
a first light-emitting device including a light-emitting unit and a light-transmitting unit;
a second light-emitting device; and
a reflecting member,
in which at least a portion of light emitted from the second light-emitting device and reflected by the reflecting member is transmitted through the light-transmitting unit of the first light-emitting device.

The invention described in claim 16 is a light-emitting module including:
a plurality of light-emitting devices aligned in a first direction,
in which the plurality of light-emitting devices emit light toward a region located on one side of the plurality of light-emitting devices, and
in which the plurality of light-emitting devices have peaks in directions which are different from each other in a light distribution on a cross section along both of the first direction and a second direction which is an emission direction of light of the plurality of light-emitting devices.

The invention described in claim 22 is a light-emitting module including:
a supporting member including a first region and a second region which is different from the first region;
a light-emitting device installed in the first region of the supporting member; and
a shielding member having a first opening,
in which the first region and the second region of the supporting member are located on an opposite side of each other with the first opening therebetween, and
in which the second region of the supporting member is fixed to a member located on the same side as the second region with respect to the shielding member.

BRIEF DESCRIPTION OF THE DRAWINGS

The objects described above, and other objects, features and advantages are further made apparent by suitable embodiments that will be described below and the following accompanying drawings.

DESCRIPTION OF EMBODIMENT

Figure 1:
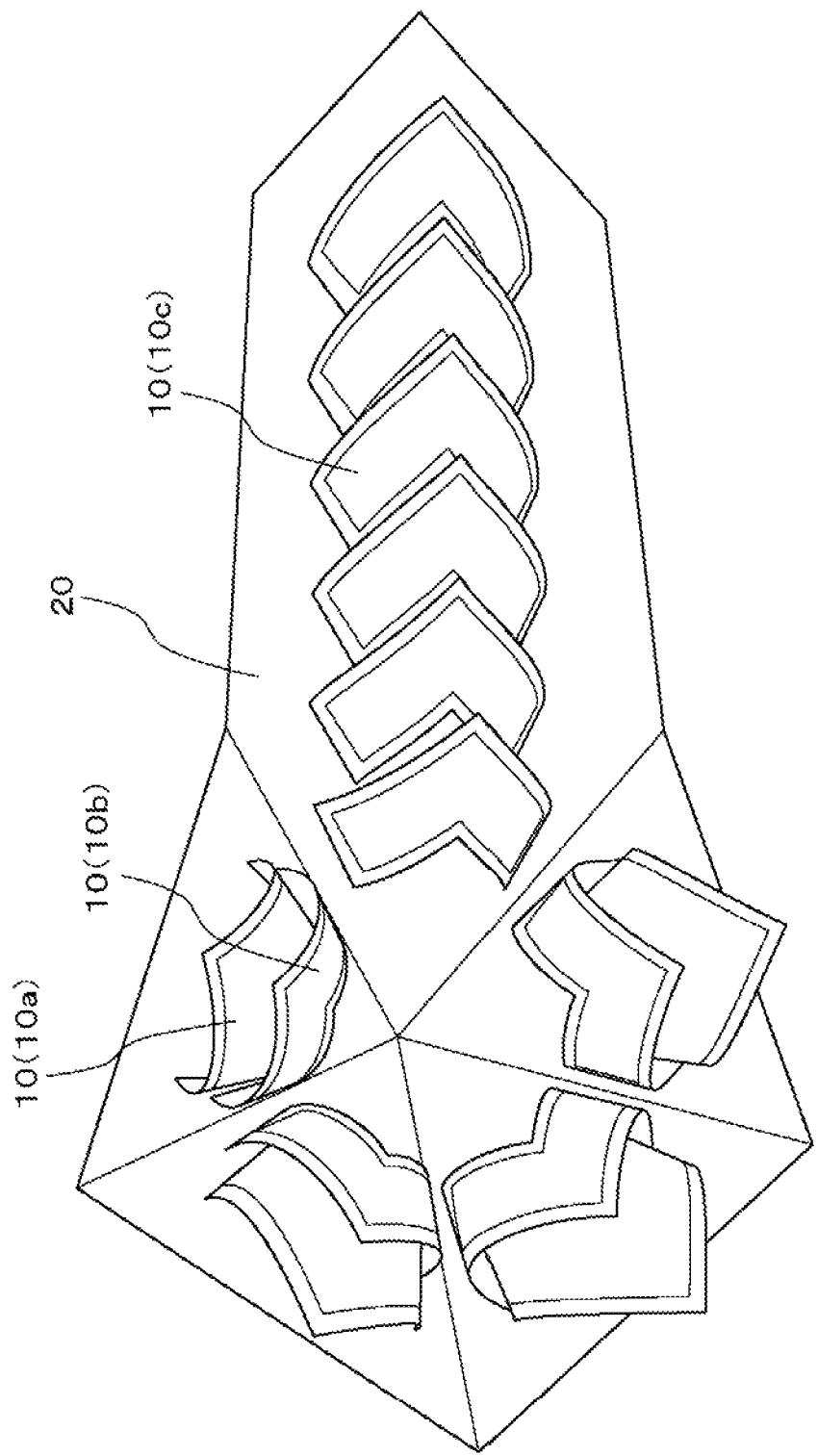
FIG. 1 is a diagram showing a light-emitting module according to an embodiment.

Embodiments of the present invention will be described below by referring to the drawings. Moreover, in all the drawings, the same constituent elements are given the same reference numerals, and descriptions thereof will not be repeated.

FIG. 1 is a diagram Showing a light-emitting module according to an embodiment.

A light-emitting module includes a plurality of light-emitting devices 10 and a reflecting member 20. The plurality of light-emitting devices 10 include a plurality of light-emitting devices 10a, a plurality of light-emitting devices 10b, and a plurality of light-emitting devices 10c.

The plurality of light-emitting devices 10 are aligned on the reflecting member 20. Light emitted from each light-emitting device 10 is reflected on the reflecting member 20, thereby generating a sense of beauty different from that of a light-emitting module without any reflecting member 20.

In the example shown in FIG. 1, six light-emitting devices 10c are aligned in a straight line along one direction, four light-emitting devices 10b are aligned surrounding a region facing one end of the six light-emitting devices 10c, and each of four light-emitting devices 10a is aligned with each of the four light-emitting devices 10b outside the four light-emitting devices 10b.

The color of light emitted from the light-emitting devices 10a and the light-emitting devices 10b may be made different from the color of light emitted from the light-emitting devices 10c. In one example, each of the light-emitting devices 10a and the light-emitting devices 10b may emit red light and the light-emitting devices 10c may emit yellow light. In this example, the difference between the light-emitting devices 10c and the set of the light-emitting devices 10a and the light-emitting devices 10b can be made conspicuous.

The light-emitting module shown in FIG. 1 can be applied to various uses. For example, the light-emitting module may be used as an automobile tail lamp.

Figure 2:
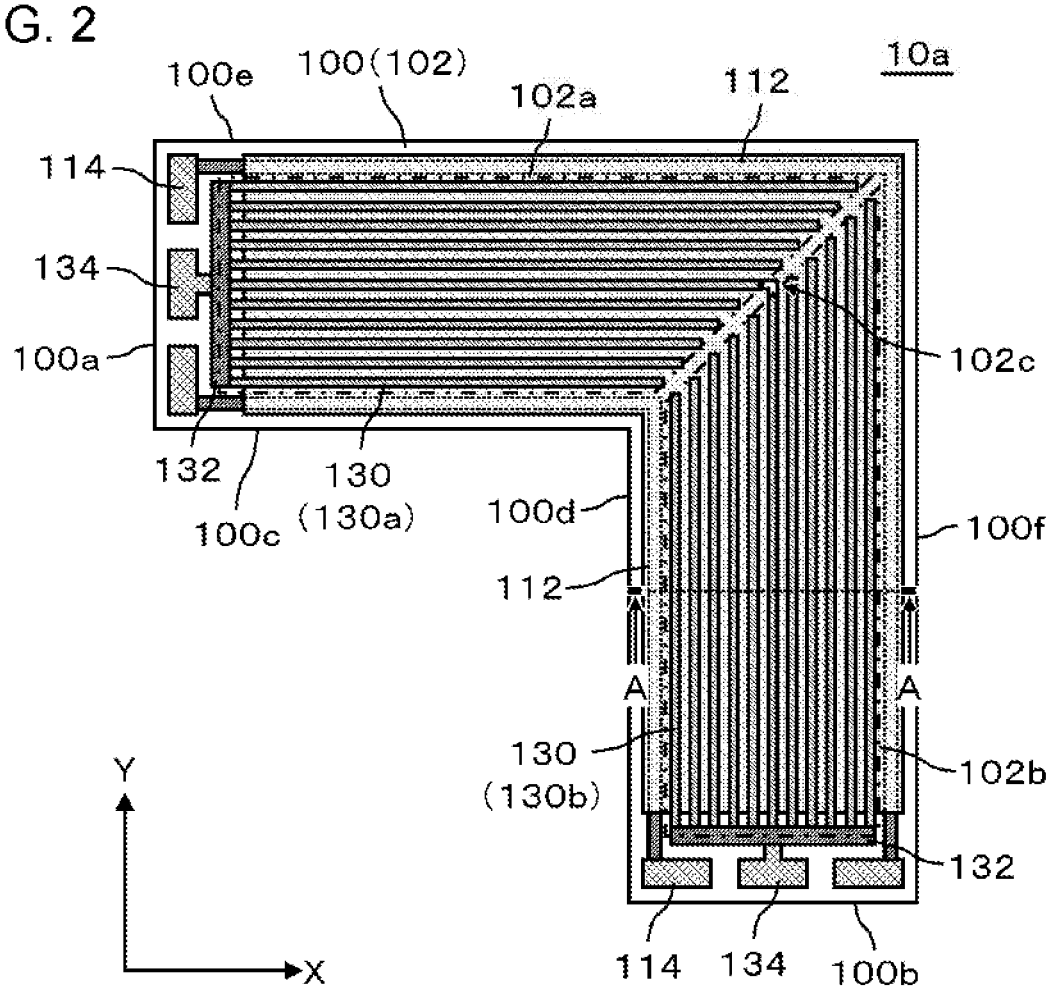
FIG. 2 is a plan view showing light-emitting devices shown in FIG. 1.
Figure 3:
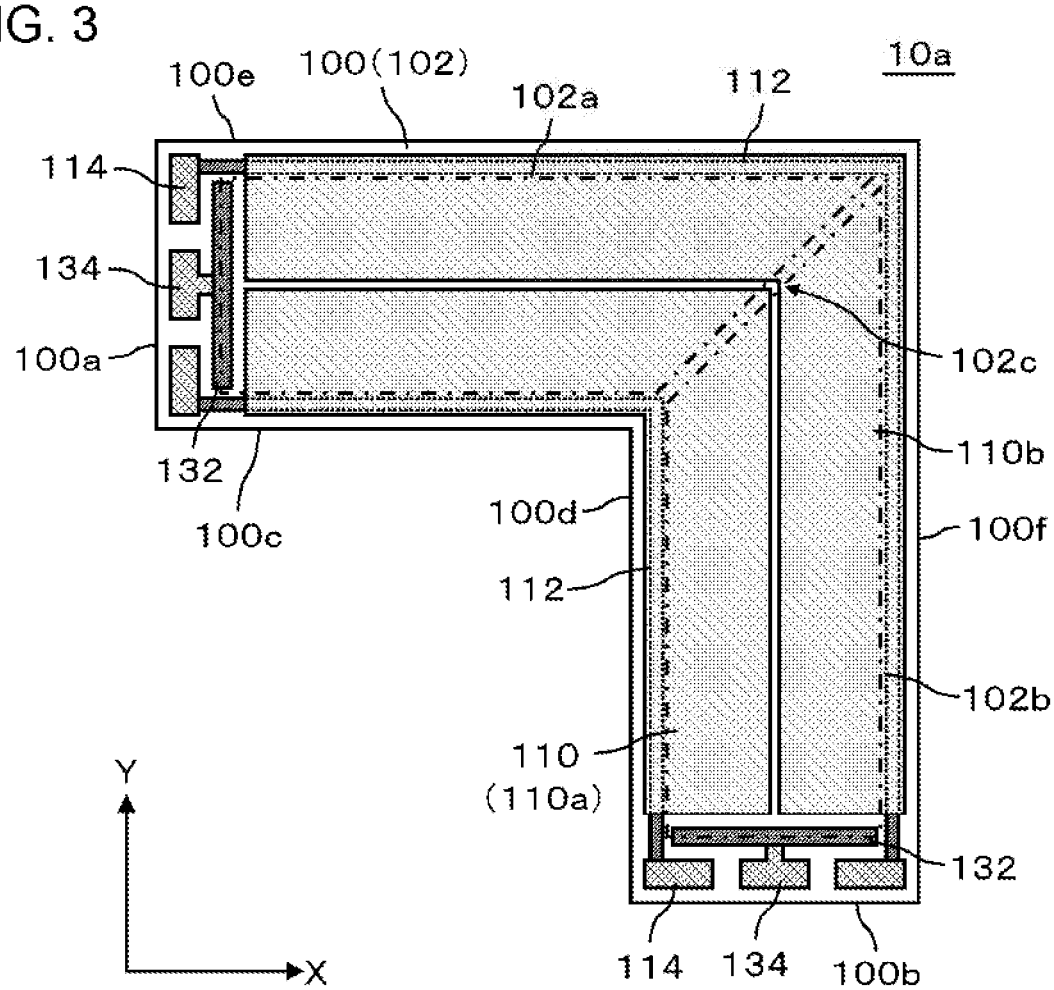
FIG. 3 is a diagram in which second electrodes are removed from FIG. 2.
Figure 4:
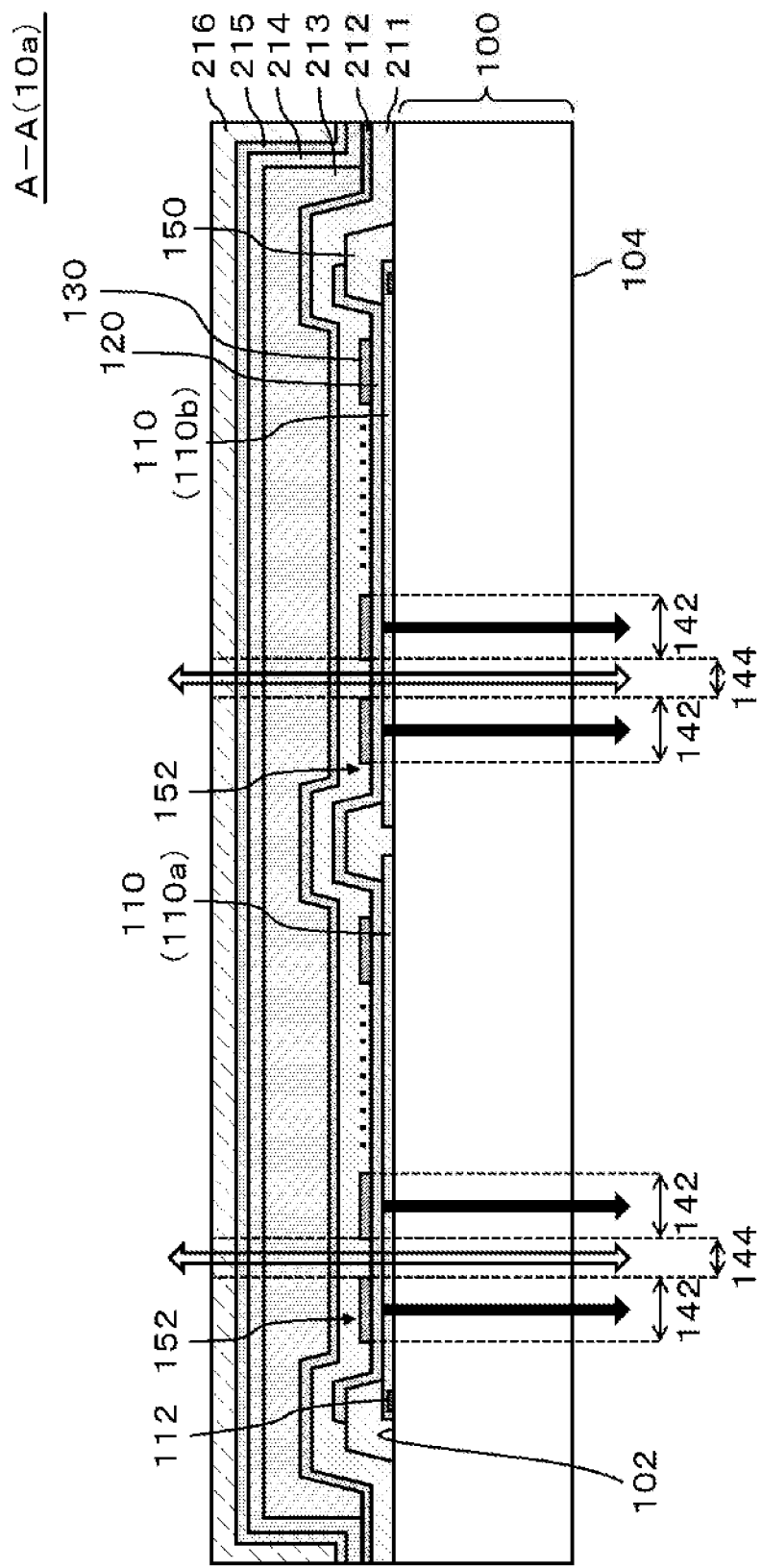
FIG. 4 is a cross-sectional view taken along line A-A of FIG. 2.

FIG. 2 is a plan view showing the light-emitting devices 10a shown in FIG. 1. FIG. 3 is a diagram in which the second electrodes 130 are removed from FIG. 2. FIG. 4 is a cross-sectional view taken along line A-A of FIG. 2. In FIGS. 2 and 3, the light-emitting device 10 is viewed from a first surface 102 (FIG. 4) side of a substrate 100.

An organic layer 120, a layer 211, a covering layer 212, an intermediate layer 213, a layer 214, a covering layer 215, and a protective layer 216 shown in FIG. 4 are not shown in FIG. 2 for ease of explanation. In addition, the width of the second electrode 130 shown in FIG. 2 does not imply the relative size of the width of the second electrode 130 with respect to the width of the substrate 100. (In FIG. 2, for ease of explanation, the relative size of the width of the second electrode 130 with respect to the width of the substrate 100 is shown bigger than that of the light-emitting device 10a which can toe actually manufactured.)

A summary of the light-emitting device 10a (light-emitting device) is explained using FIGS. 2-4. The light-emitting device 10a includes a first electrode 110, the organic layer 120, a plurality of second electrodes 130a (second electrodes 130 of a first group), and a plurality of second electrodes 130b (second electrodes 130 of a second group). The first electrode 110 is located on the first surface 102 of the substrate 100. The organic layer 120 is located on the first electrode 110. The plurality of second electrodes 130a are located on the organic layer 120 and extend in a first direction (X direction of FIG. 2). The second electrodes 130b are located on the organic layer 120 and extend in a second direction (Y direction of FIG. 2) orthogonal to the first direction. As shown in FIG. 2, the first surface 102 of the substrate 100 includes a first region 102a, a second region 102b, and a third region 102c. The plurality of second electrodes 130a are located in the first region 102a. The plurality of second electrodes 130b are located in the second region 102b. The third region 102c is located between the first region 102a and the second region 102b, and the second electrode 130 is not located in the third region 102c. Particularly in the example shown in FIG. 2, none of the plurality of second electrodes 130a intersect any of the plurality of second electrodes 130b.

According to the above-mentioned configuration, the plurality of second electrodes 130 (the plurality of second electrodes 130a and the plurality of second electrodes 130b) can be favorably deposited. Specifically, assuming that each of the plurality of second electrodes 130a intersects each of the plurality of second electrodes 130b, as described later using FIG. 6, an opening including a bending portion (a bending portion 322 shown in FIG. 6) is formed in a mask used for deposition of the plurality of second electrodes 130. When gravity acts on such a mask, there is a possibility of the mask being greatly deformed in the bending portion and the surroundings thereof, that is, there is a possibility that the second electrodes 130 cannot be favorably deposited. In contrast, in the above-mentioned configuration, as described later using FIG. 5, the second electrode 130 can be deposited without forming the opening including the bending portion in the mask. There is low possibility of such a mask being deformed by gravity. Therefore, the plurality of second electrodes 130 (the plurality of second electrodes 130a and the plurality of second electrodes 130b) can be favorably deposited.

Meanwhile, some of the plurality of second electrodes 130a may intersect any of the plurality of second electrodes 130b. In other words, at least one of the plurality of second electrodes 130a need not intersect any of the plurality of second electrodes 130b. In this example, the opening including the bending portion is formed in the mask. However, the number of bending portions can be reduced in comparison to the later described the example shown in FIG. 6 (that is, an example of all of the plurality of second electrodes 130a intersecting any of the plurality of second electrodes 130b). Therefore, even in a case where at least one of the plurality of second electrodes 130a does not intersect any of the plurality of second electrodes 130b, it is possible to inhibit the mask from being deformed, and the plurality of second electrodes 130 can be favorably deposited to a certain degree.

Details of the plan layout of the light-emitting device 10a is explained using FIGS. 2-3.

The light-emitting device 10a includes the substrate 100, the first electrode 110, a conductive portion 112, a terminal 114, a plurality of second electrodes 130, a conductive portion 132, and a terminal 134.

The substrate 100 is L-shaped. Specifically, the substrate 100 includes a side 100a, a side 100b, a side 100c, a side 100d, a side 100e, and a side 100f. The substrate 100 extends from the side 100a to the side 100b. The side 100c and the side 100d extend from the side 100a and the side 100b, respectively, and intersect each other. The side 100e and the side 100f are on the opposite sides of the side 100c and the side 100d, respectively, and extend from the side 100a and the side 100b, respectively, intersecting each other. The side 100e and the side 100f are longer than the side 100c and the side 100d, respectively.

The substrate 100 is formed of a flexible material. Therefore, as shown in FIG. 1, the light-emitting device 10a (that is, the substrate 100) can be curved.

The first electrode 110 includes a plurality of segments which are separated from each other, and in the example shown in FIG. 3, the first electrode 110 includes a first segment 110a and a second segment 110b. The first segment 110a and the second segment 110b continuously extend from the side 100a to the side 100b, that is, from the first region 102a to the second region 102b via the third region 102c. The first segment 100a and the second segment 110b are aligned in a direction intersecting the extending direction of the substrate 100, that is, in a direction from the side 100c and the side 100d toward the side 100e and the side 100f. The first segment 110a is located nearer to the side 100c and the side 100d than the second segment 110b, and the second segment 110b is located nearer to the side 100e and the side 100f than the first segment 110a.

By aligning the plurality of segments (the first segment 110a and the second segment 110b) in a direction intersecting the extending direction of the plurality of second electrodes 130, a light-emitting unit 142 configured of the first segment 110a (for example, FIG. 4) and a light-emitting unit 142 configured of the second segment 110b (for example, FIG. 4) can be controlled independently of each other.

The first electrode 110 can be formed without performing deposition using a mask. Therefore, unlike the second electrode 130, the first electrode 110 need not be discontinued in the third region 102c. Therefore, the first electrode 110 (the first segment 110a and the second segment 110b) continuously extends from the first region 102a to the second region 102b via the third region 102c. In another example, the first electrode 110 may be formed by deposition using a mask. In this case, the first electrode 110 may be discontinued in the third region 102c. The first electrode 110 can be favorably deposited as is the case with the second electrode 130.

The conductive portion 112 functions as an auxiliary electrode of the first electrode 110. Specifically, two conductive portions 112 extend from the side 100a to the side 100b, that is, from the first region 102a to the second region 102b via the third region 102c. The sheet resistance of each conductive portion 112 is lower than that of the first electrode 110. Each conductive portion 112 is formed of a material (for example, metal, and more specifically, Mo/Al/Mo (MAM)) having higher conductivity than that of a conductive material included in the first electrode 110. In the example shown in FIG. 3, one conductive portion 112 extends along the side 100c and the side 100d and is covered by the first segment 110a. The other conductive portion 112 extends along the side 100e and the side 100f and is covered by the second segment 110b.

The first electrode 110 can be supplied with electrical potential from the outside of the light-emitting device 10 via the terminal 114. Specifically, the terminal 114 disposed along the side 100a is connected to one end of the conductive portion 112 extending along the side 100c, and the terminal 114 disposed along the side 100b is connected to the other end of the conductive portion 112 extending along the side 100d. Similarly, the terminal 114 disposed along the side 100a is connected to one end of the conductive portion 112 extending along the side 100e, and the terminal 114 disposed along the side 100b is connected to the other end of the conductive portion 112 extending along the side 100f.

It is possible to inhibit voltage of the conductive portion 112 from dropping in the extending direction of the conductive portion 112 by connecting the terminals 114 to both ends of the conductive portion 112. Variation in the brightness distribution of the light-emitting units 142 (for example, FIG. 4) may be inhibited by inhibiting a voltage drop in the conductive portion 112.

The plurality of second electrodes 130 include the plurality of second electrodes 130a and the plurality of second electrodes 130b. The plurality of second electrodes 130a extend in a striped pattern in the first direction (X direction of FIG. 2) from the side 100a toward the third region 102c. In the example shown in FIG. 2, the plurality of second electrodes 130a are aligned at substantially constant intervals along the second direction (Y direction of FIG. 2) from the side 100c toward the side 100e. In another example, the interval between second electrodes 130a adjacent to each other may vary depending on the set of second electrodes 130*a* adjacent to each other. The plurality of second electrodes 130*b* extend in a striped pattern in the second direction (Y direction of FIG. 2) from the side 100*b* toward the third region 102*c*. In the example shown in FIG. 2, the plurality of second electrodes 130*b* are aligned at substantially constant intervals along the first direction (X direction of FIG. 2) from the side 100*d* toward the side 100*f*. In another example, the interval between second electrodes 130*b* adjacent to each other may vary depending on the set of second electrodes 130*b* adjacent to each other.

The plurality of second electrodes 130*a* and the plurality of second electrodes 130*b* are substantially symmetrically arranged with respect to the third region 102*c*. Specifically, the plurality of second electrodes 130*a* and the plurality of second electrodes 130*b* include a pair of second electrodes 130 substantially symmetrically arranged with respect to the third region 102*c*. Of the pair, the length and the width of one second electrode 130 are substantially equal to the length and the width of the other second electrode 130. In more detail, the third region 102*c* is linear, and the plurality of second electrodes 130*a* and the plurality of second electrodes 130*b* are axisymmetrically arranged with respect to the straight line. Therefore, the brightness distribution of the light-emitting unit 142 configured by the one second electrode 130 (FIG. 4) and the brightness distribution of the light-emitting unit 142 configured by the other second electrodes 130 (FIG. 4) can be made substantially symmetric with respect to the third region 102*c*.

The plurality of second electrodes 130*a* can be supplied with electrical potential from the outside of the light-emitting device 10 via the terminal 134. Specifically, the terminal 134 (first terminal) is located on the opposite side of the third region 102*c* with the plurality of second electrodes 130*a* therebetween, and is disposed along the side 100*a* in the examples shown in FIGS. 2-3. The terminal 134 is connected to the plurality of second electrodes 130*a* via the conductive portion 132 between the terminal 134 and the plurality of second electrodes 130*a*.

The plurality of second electrodes 130*b* can be supplied with electrical potential from the outside of the light-emitting device 10 via the terminal 134. Specifically, the terminal 134 (second terminal) is located on the opposite side of the third region 102*c* with the plurality of second electrodes 130*b* therebetween, and arranged along the side 100*b* in the example shown in FIGS. 2-3. The terminal 134 is connected to the plurality of second electrodes 130*b* via the conductive portion 132 between the terminal 134 and the plurality of second electrodes 130*b*.

The terminal 134 connected to the plurality of second electrodes 130*a* and the terminal 134 connected to the plurality of second electrodes 130*b* are substantially symmetrically arranged with respect to the third region 102*c*. In more detail, the third region 102*c* is linear, and the terminal 134 connected to the plurality of second electrodes 130*a* and the terminal 134 connected to the plurality of second electrodes 130*b* are axisymmetrically arranged with respect to the straight line. Specifically, the distance from the terminal 134 connected to the plurality of second electrodes 130*b* to the third region 102*c* is substantially equal to the distance from the terminal 134 connected to the plurality of second electrodes 130*a* to the third region 102*c*. Therefore, the brightness distribution of the light-emitting unit 142 (FIG. 4) from the terminal 134 connected to the plurality of second electrodes 130*a* to the third region 102*c* and the brightness distribution of the light-emitting unit 142 (FIG. 4) from the terminal 134 connected to the plurality of second electrodes 130*b* to the third region 102*c* can be made substantially symmetric with respect to the third region 102*c*.

Details of the cross-sectional structure of the light-emitting device 10*a* is explained using FIG. 4.

The light-emitting device 10*a* includes the substrate 100, the first electrode 110, the organic layer 120, the second electrode 130, an insulating layer 150, the layer 211, the covering layer 212, the intermediate layer 213, the layer 214, the covering layer 215, and the protective layer 216.

The light-emitting device 10*a* includes the plurality of light-emitting units 142 and a plurality of light-transmitting units 144. Each light-emitting unit 142 is formed of a laminated structure of the first electrode 110, the organic layer 120, and the second electrode 130. Each light-transmitting unit 144 is located between the light-emitting units 142 adjacent to each other. The light-emitting device 10*a* has light-transmitting properties due to the plurality of light-transmitting units 144.

The substrate 100 includes the first surface 102 and the second surface 104. The first electrode 110, the organic layer 120, the second electrode 130, the insulating layer 150, the layer 211, the covering layer 212, the intermediate layer 213, the layer 214, the covering layer 215, and the protective layer 216 are located on the first surface 102 side of the substrate 100. The second surface 104 is located on the opposite side of the first surface 102.

The substrate 100 is composed of a material having light-transmitting properties. Therefore, light, can be transmitted through the substrate 100.

The substrate 100 is composed of, for example, glass or a resin. The resin may be, for example, polyethylene naphthalate (PEN), polyether sulphone (PES), polyethylene terephthalate (PET), or polyimide. In a case where the substrate 100 is composed a resin, at least one of the first surface 102 and the second surface 104 of the substrate 100 may be covered by an inorganic barrier layer (for example, SiNx or SiON). It is possible to inhibit a substance which can deteriorate the organic layer 120 (for example, vapor) from permeating the substrate 100 by the inorganic barrier film.

The first electrode 110 includes a light-transmitting conductive material and has light-transmitting properties. The light-transmitting conductive material may be, for example, a metal oxide (for example, an indium tin oxide (ITO), an indium zinc oxide (IZO), an indium tungsten zinc oxide (IWZO), a zinc oxide (ZnO)) or an indium gallium zinc oxide (IGZO), a carbon nanotube, an electroconductive polymer (for example, PEDOT/PSS), or a metal film (for example, Ag) having light-transmitting properties, or an alloy film (for example, AgMg).

In the example shown in FIG. 4, the first segment 110*a* and the second segment 110*b* of the first electrode 110 extend across the plurality of light-emitting units 142. The plurality of light-emitting units 142 include a common first electrode 110 except an area between the first segment 110*a* and the second segment 110*b*.

The organic layer 120 includes a light-emitting layer (EML) which emits light by organic electroluminescence, and may appropriately include a hole injection layer (HIL), a hole transport layer (HTL), an electron transport layer (ETL), and an electron injection layer (EIL). A hole is injected from the first electrode 110 to the EML, an electron is injected from the second electrode 130 to the EML, and the hole and the electron are recombined in the EML to emit light.

In the example shown in FIG. 4, the organic layer 120 extends across the plurality of light-emitting units 142. In the example shown in FIG. 4, the colors of light emitted from the plurality of light-emitting units 142 are the same, and for example, may be red. In this case, the organic layer 120 configuring each light-emitting unit 142 need not be separated from another organic layer 120, and the organic layers 120 can be extended across the plurality of light-emitting units 142. In another example, the organic layer 120 configuring each light-emitting unit 142 may be separated from another organic layer 120.

The second electrode 130 includes a light-shielding conductive material, and has light shielding properties, particularly light reflectivity. The light-shielding conductive material may be a metal, particularly, a metal selected from a group consisting of Al, Au, Ag, Pt, Mg, Sn, Zn, and In, or an alloy of metals selected from this group.

The insulating layer 150 includes two openings 152. One opening 152 exposes a portion of the first segment 110*a*, and the other opening 152 exposes a portion of the second segment 110*b*. The plurality of light-emitting units 142 are located in each opening 152. In each light-emitting unit 142, the first electrode 110, the organic layer 120, and the second electrode 130 configure a laminated structure.

The insulating layer 150 covers an end of the first segment 110*a* on the opposite side of the second segment 110*b*, and covers an end of the second segment 110*b* on the opposite side of the first segment 110*a*. Thus, contact between the first electrode 110 and the second electrode 130, that is, a short circuit is prevented between the first electrode 110 and the second electrode 130.

In the example shown in FIG. 4, the end of the first segment 110*a* on the opposite side of the second segment 110*b* covers one conductive portion 112, and the end of the second segment 110*b* on the opposite side of the first segment 110*a* covers the other conductive portion 112. As is clear from the explanation of the present embodiment, the location at which the conductive portion 112 is provided is not limited to the example shown in FIG. 4. In one example, the conductive portion 112 may be covered with the insulating layer 150 on the first electrode 110.

The insulating layer 150 may be, for example, an organic insulating layer (for example, polyimide) or an inorganic insulating layer (for example, SiO$_2$).

The layer 211, the covering layer 212, the intermediate layer 213, the layer 214, the covering layer 215, and the protective layer 216 are laminated in order from the first surface 102 of the substrate 100. The layer 211, the covering layer 212, the intermediate layer 213, the layer 214, the covering layer 215, and the protective layer 216 function as a sealing portion to seal the light-emitting unit 142, particularly, the organic layer 120.

The layer 211 is provided in order to prevent the covering layer 212 (as described later, the covering layer 212 is formed by Atomic Layer Deposition (ALD)) from peeling off. The layer 211 is formed by Chemical Vapor Deposition (CVD), and includes an inorganic material (for example, SiN). When the covering layer 212 is formed directly on an organic layer (for example, organic layer 120), there is a risk of the covering layer 212 peeling off. The covering layer 212 can be prevented from peeling off by the layer 211.

The covering layer 212 is provided to shield the light-emitting unit 142, particularly, the organic layer 120 from substances (for example, vapor or oxygen) which can deteriorate the light-emitting unit 142 and the organic layer 120. The covering layer 212 is formed by ALD, and includes an inorganic material having insulating properties.

The intermediate layer 213 is provided in order to relieve stress of the covering layer 215 (as described later, the covering layer 215 is formed by ALD). In one example, the intermediate layer 213 may be a resin layer.

The layer 214 is provided in order to prevent the covering layer 215 from peeling off. The layer 211 is formed by sputtering, and includes an inorganic material (for example, SiON). When the covering layer 215 is formed directly on an organic layer (for example, the intermediate layer 213), there is a risk of the covering layer 215 peeling off. The covering layer 215 can be prevented from peeling off by the layer 214.

The covering layer 215 is provided to shield the light-emitting unit 142, particularly, the organic layer 120, from substances (for example, vapor or oxygen) which can deteriorate the light-emitting unit 142 and the organic layer 120. The covering layer 215 is formed by ALD, and includes an inorganic material having insulating properties.

The protective layer 216 is provided in order to protect the light-emitting unit 142, the layer 211, the covering layer 212, the intermediate layer 213, the layer 214, and the covering layer 215. In one example, the protective layer 216 may be a resin layer.

In the example shown in FIG. 4, the covering layer 212 (inorganic layer) and the layer 214 (inorganic layer) are in contact with each other on the outside of an end of the intermediate layer 213. That is, the end of the intermediate layer 213 is prevented from being exposed by the covering layer 212 and the layer 214. Therefore, it is possible to prevent substances (for example, vapor or oxygen) which can deteriorate the light-emitting unit 142, particularly, the organic layer 120, from entering from the end of the intermediate layer 213.

Meanwhile, when the layer 211 is formed by CVD and includes silicon oxynitride, and the layer 214 is formed by sputtering and includes silicon oxynitride, the composition ratio of oxygen atoms in the layer 214 is preferably greater than the composition ratio of oxygen atoms in the covering layer 212. By adopting such a configuration, high moisture-proof properties can be obtained by the layer 211 which is near the organic layer 120, and a greater effect of stress relaxation can be obtained by the layer 214. In addition, sealing failure such as cracks in the sealing portion or the like can be reduced.

The structure to seal the organic layer 120 is not limited to the example shown in FIG. 4 (the layer 211, the covering layer 212, the intermediate layer 213, the layer 214, the covering layer 215, and the protective layer 216). As is clear from the explanation of the present embodiment, the organic layer 120 may be sealed by a structure which is different from the structure shown in FIG. 4.

As shown with a black arrow in FIG. 4, in the light-emitting unit 142, light emitted from the organic layer 120 is reflected by the second electrode 130, the light hardly transmitted through the second electrode 130. The light is then transmitted through the first electrode 110 and the substrate 100, and is emitted from the second surface 104 of the substrate 100.

As shown with a white arrow in FIG. 4, in the light-transmitting unit 144, light from outside the light-emitting device 10 is transmitted through the substrate 100, the first electrode 110, the organic layer 120, the layer 211, the covering layer 212, the intermediate layer 213, the layer 214, the covering layer 215, and the protective layer 216. Therefore, in the example shown in FIG. 2, the light-emitting device 10*a* includes a light-transmitting unit 144 (FIG. 4) between adjacent second electrodes 130*a* out of the plurality of second electrodes 130*a*, and a transmitting unit 144 (FIG.

4) between adjacent second electrodes 130*b* out of the plurality of second electrodes 130*b*.

Figure 5:
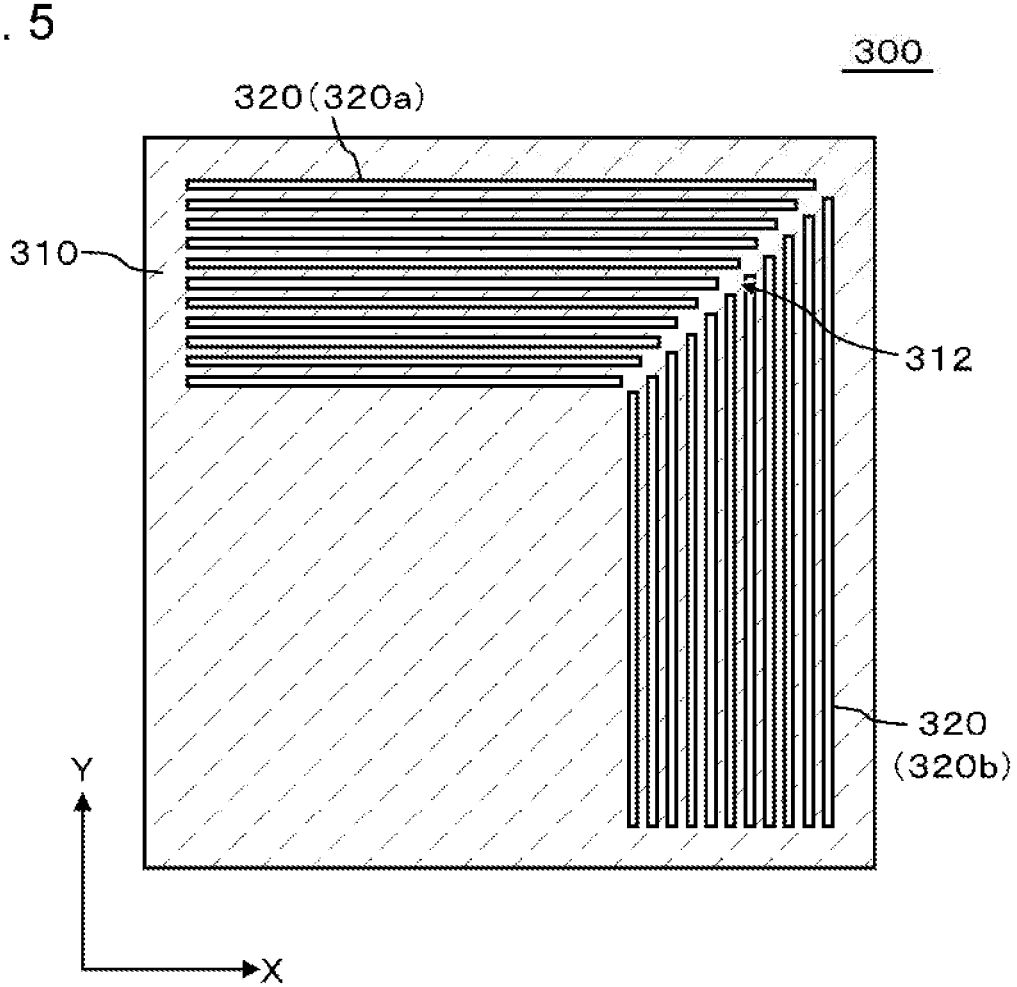
FIG. 5 is a plan view showing a mask used in formation of the second electrodes of the light-emitting devices shown in FIGS. 2-4.

FIG. 5 is a plan view showing a mask 300 used in formation of the second electrode 130 of the light-emitting devices 10*a* shown in FIGS. 2-4.

The mask 300 includes a shielding member 310 and a plurality of openings 320. The plurality of openings 320 are formed in the shielding member 310. The plurality of openings 320 include a plurality of openings 320*a* and a plurality of openings 320*b*. The plurality of openings 320*a* extend in the X direction in the drawing. The plurality of openings 320*b* extend in the Y direction in the drawing. The shielding member 310 includes a portion in which the opening 320 is not formed (a portion 312 in the drawing) between the plurality of openings 320*a* and the plurality of openings 320*b*. That is, the plurality of openings 320*a* and the plurality of openings 320*b* are separated by the portion 312. Each of the plurality of second electrodes 130*a* (FIG. 2) is formed by each of the plurality of openings 320*a*, each of the plurality of second electrodes 130*b* (FIG. 2) is formed by each of the plurality of openings 320*b*, and a third region 102*c* (that is, a region in which the second electrode 130 is not formed) is formed by the portion 312.

Figure 6:
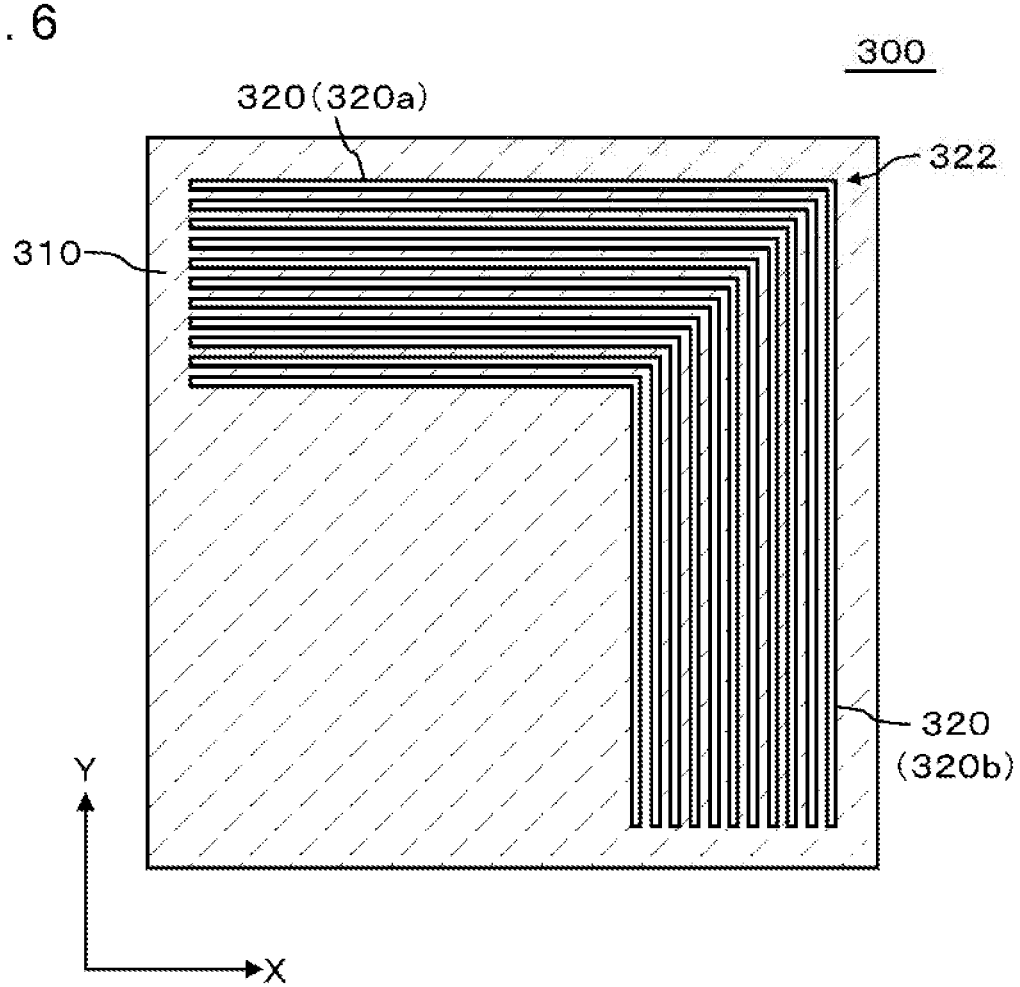
FIG. 6 is a plan view showing a mask according to a comparative example.

FIG. 6 is a plan view showing the mask 300 according to a comparative example. The mask 300 according to the comparative example is the same as the mask 300 shown in FIG. 5 except the following.

In the comparative example, all of the plurality of openings 320*a* intersect all of the plurality of openings 320*b* in a region corresponding to the portion 312 shown in FIG. 5. Therefore, the bending portion 322 is formed in all of the openings 320.

The mask 300 shown in FIG. 5 and the mask 300 shown in FIG. 6 are compared. There is a high possibility of the mask 300 being deformed when gravity acts on the mask 300, since many bending portions 322 are formed in the mask 300 shown in FIG. 6. In contrast, in the mask 300 shown in FIG. 5, there is a low possibility of the mask 300 being deformed even when gravity acts on the mask 300, since the bending portions 322 shown in FIG. 6 are not formed in the mask 300. Therefore, the plurality of second electrodes 130 (FIG. 2) can be more favorably deposited by using the mask 300 shown in FIG. 5 than the mask 300 shown in FIG. 6.

Meanwhile, in an example which is different from the one shown in FIG. 5, some of the plurality of openings 320*a* may intersect any of the plurality of openings 320*b*. In other words, at least one of the plurality of second electrodes 130*a* need not intersect any of the plurality of second electrodes 130*b*. In this example, the bending portion 322 is formed in some of the plurality of openings 320. However, the number of the bending portions 322 can be reduced compared to the example shown in FIG. 6. Therefore, even when at least one of the plurality of second electrodes 130*a* does not intersect any of the plurality of second electrodes 130*b*, it is possible to inhibit the mask 300 from being deformed, and the plurality of second electrodes 130 (FIG. 2) can be favorably deposited to a certain degree.

Next, an example of a method of manufacturing the light-emitting device 10*a* is explained using FIGS. 4-5.

First, the first electrode 110 is formed on the first surface 102 of the substrate 100. In one example, the first electrode 110 can be formed by patterning a conductive material.

Then, the insulating layer 150 is formed on the first surface 102 of the substrate 100. In one example, the insulating layer 150 can be formed by patterning an insulating material.

Thereafter, the organic layer 120 is formed over the first surface 102 of the substrate 100. In one example, at least one layer of the organic layer 120 can be formed by a coating process.

Next, the second electrode 130 is formed over the first surface 102 of the substrate 100. The second electrode 130 can be formed by deposition using the mask 300 shown in FIG. 5.

Next, the layer 211, the covering layer 212, the intermediate layer 213, the layer 214, the covering layer 215, and the protective layer 216 are formed in an order over the first surface 102 of the substrate 100.

The light-emitting device 10*a* is manufactured in the above manner.

Figure 7:
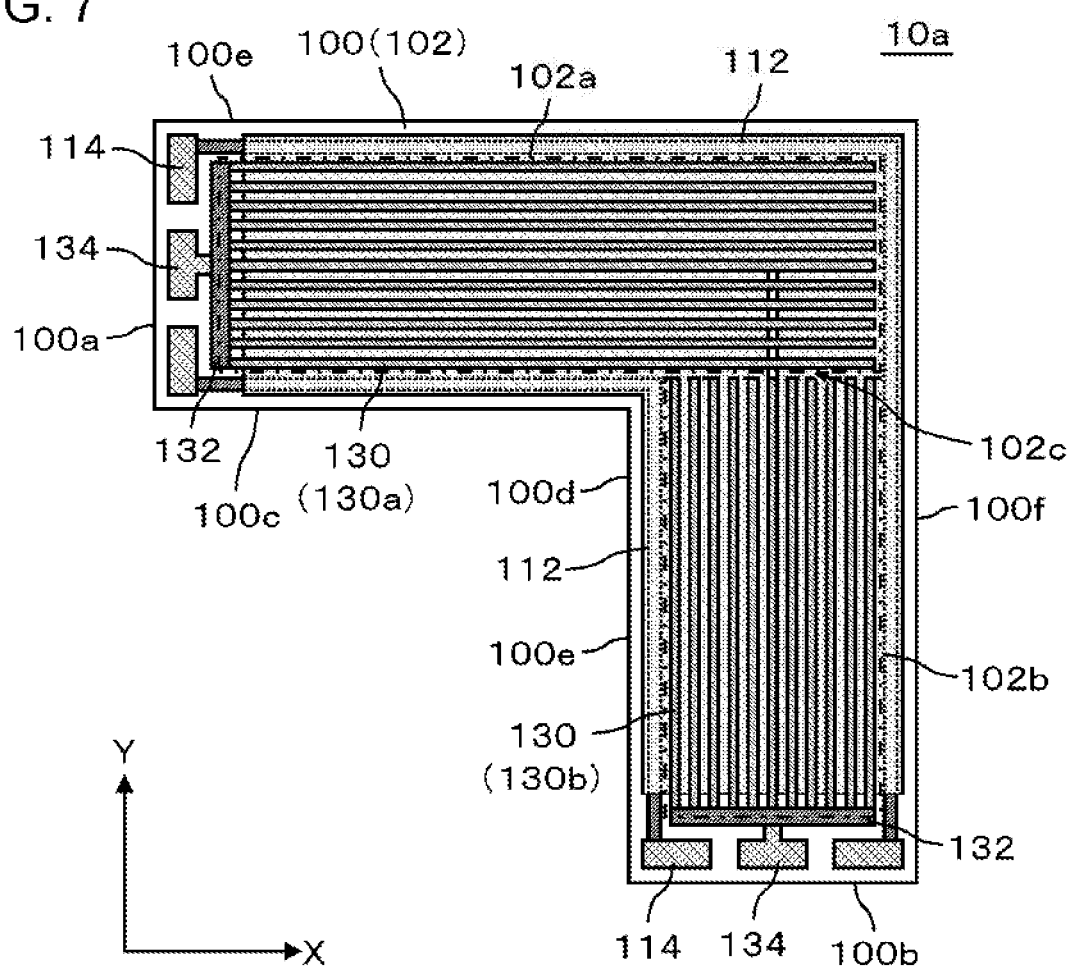
FIG. 7 is a diagram showing a modification example of FIG. 2.

FIG. 7 is a diagram showing a modification example of FIG. 2.

The plurality of second electrodes 130*a* and the plurality of second electrodes 130*b* are not symmetrically arranged with respect to the third region 102*c*. Specifically, the plurality of second electrodes 130*a* extend in a first direction (X direction of FIG. 7) from the side 100*a* toward the side 100*f* in a striped pattern. The plurality of second electrodes 130*b* extend from the side 100*b* in a second direction (Y direction of FIG. 7) in a striped pattern. The plurality of second electrodes 130*b* do not reach the side 100*e*, but face the side 100*e* with the plurality of second electrodes 130*a* therebetween. The second electrodes 130*b* are shorter than the second electrodes 130*a*.

In the example shown in FIG. 7, the plurality of second electrodes 130*a* have substantially equivalent lengths in the first direction (X direction of FIG. 7). Therefore, voltage drops between both ends of the second electrodes 130*a* can be inhibited from varying between the plurality of second electrodes 130*a*. Therefore, luminescence of the light-emitting units 142 (FIG. 4) in the extending direction of the second electrode 130*a* (X direction of FIG. 7) can be inhibited from varying between the plurality of second electrodes 130*a*.

Similarly, in the example shown in FIG. 7, the plurality of second electrodes 130*b* have substantially equivalent lengths in the second direction (Y direction of FIG. 7). Therefore, voltage drops between both ends of the second electrode 130*b* can be inhibited from varying between the plurality of second electrodes 130*b*. Therefore, the luminescence of the light-emitting units 142 (FIG. 4) in the extending direction of the second electrodes 130*b* (Y direction of FIG. 7) can be inhibited from varying between the plurality of second electrodes 130*b*.

Figure 8:
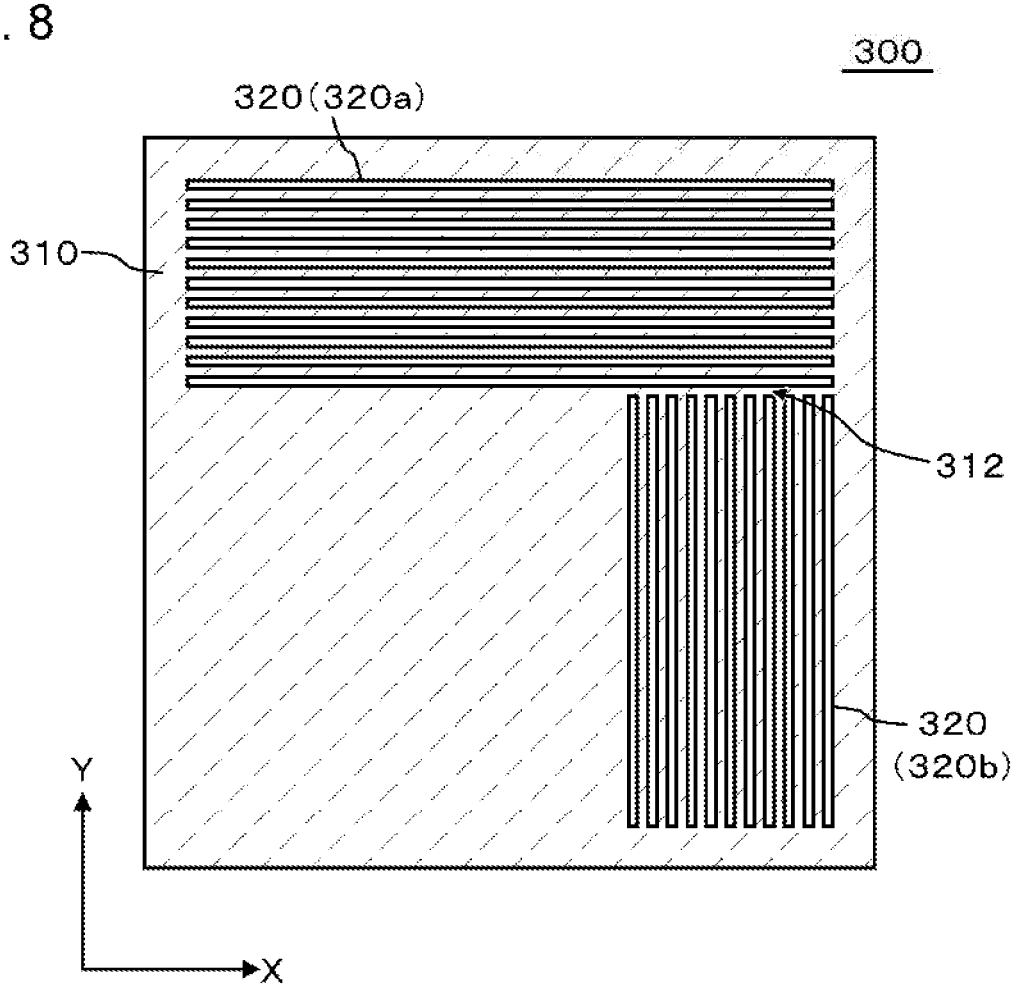
FIG. 8 is a plan view showing a mask used in formation of the second electrodes of the light-emitting devices shown in FIG. 7.

FIG. 8 is a plan view showing the mask 300 used in formation of the second electrode 130 of the light-emitting device 10*a* shown in FIG. 7.

The plurality of openings 320*a* and the plurality of openings 320*b* are separated by the portion 312. Therefore, a bending portion corresponding to the bending portion 322 shown in FIG. 6 is not formed in the opening 320.

In the example shown in FIG. 8 also, it is possible to inhibit the mask 300 from being deformed, and the plurality of second electrodes 130 (FIG. 7) can be favorably deposited.

Figure 9:
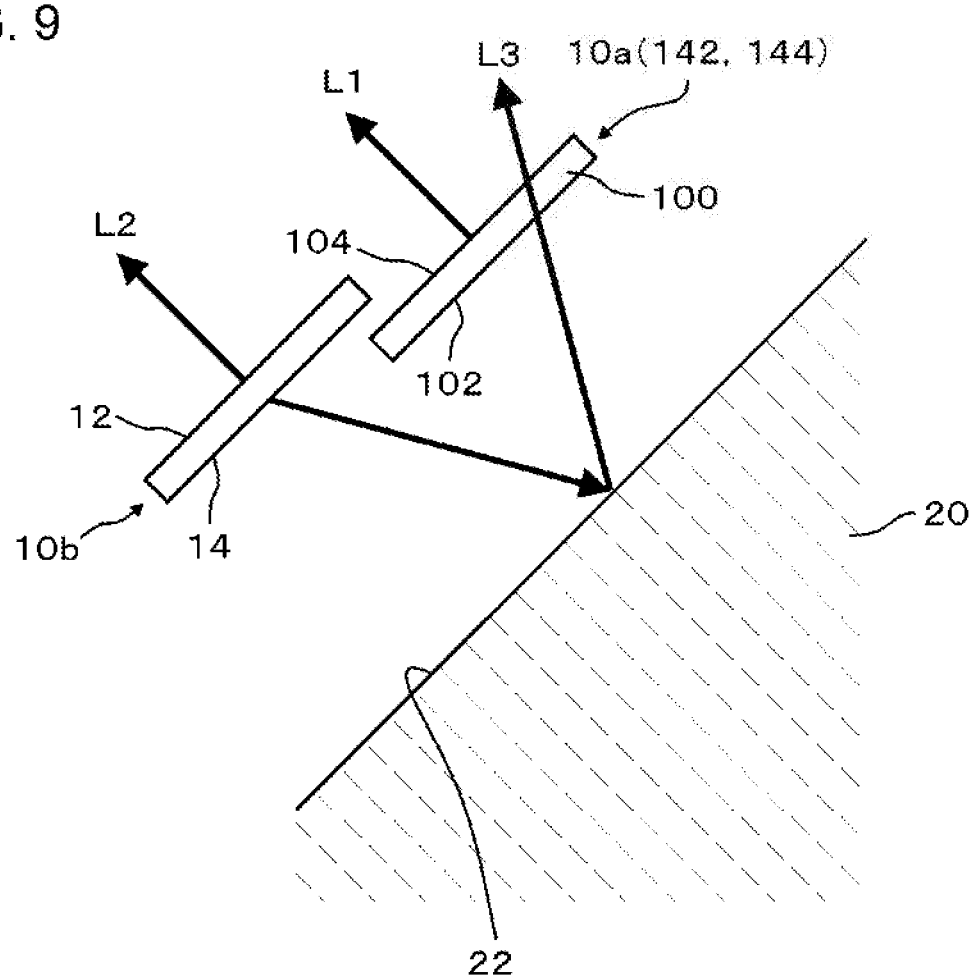
FIG. 9 is a diagram to explain Example 1 of the light-emitting devices and an arrangement of the light-emitting devices (light-emitting module) shown in FIG. 1.

FIG. 9 is a diagram to explain Example 1 of the arrangement of the light-emitting device 10*a* and the light-emitting device 10*b* (light-emitting module) shown in FIG. 1.

A summary of the light-emitting module is explained using FIG. 9. The light-emitting module includes the light-emitting device 10*a* (first light-emitting device), the light-emitting device 10*b* (second light-emitting device), and the reflecting member 20. As explained using FIG. 4, the light-emitting device 10a includes the light-emitting unit 142 and the light-transmitting unit 144. At least a portion of light (light L3 in FIG. 9) emitted from the light-emitting device 10b and reflected by the reflecting member 20 is transmitted through the light-transmitting unit 144 of the light-emitting device 10a.

According to the above-mentioned configuration, it is possible to combine light emitted from the light-emitting device 10a and light emitted from the light-emitting device 10b by a novel method. Specifically, in the above-mentioned configuration, light emitted from the light-emitting device 10b and reflected by the reflecting member 20 (light L3 in FIG. 9) is transmitted through the light-transmitting unit 144 of the light-emitting device 10a. Therefore, it is possible to combine light emitted from the light-emitting device 10a and light emitted from the light-emitting device 10b by the light-transmitting unit 144 of the light-emitting device 10a.

In one example, the wavelength of light emitted from the light-emitting device 10b can be made substantially equal to the wavelength of light emitted from the light-emitting device 10a. In this example, luminescence of light emitted from the light-emitting device 10a can be enhanced compared to an example in which the light-emitting device 10b is not provided.

In another example, the wavelength of light emitted from the light-emitting device 10b can be made different from the wavelength of light emitted from the light-emitting device 10a. In this example, by combining light emitted from the light-emitting device 10a and light emitted from the light-emitting device 10b, light of a color can be generated that is different from either the color of light emitted from the light-emitting device 10a or the color of light emitted from the light-emitting device 10b, without separately coloring a light-emitting layer so that a different color is emitted or providing a complicated circuit system.

Details of the light-emitting module is explained using FIG. 9.

The substrate 100 of the light-emitting device 10a includes the first surface 102 and the second surface 104. The light-emitting device 10a is arranged so that the first surface 102 of the substrate 100 faces a reflecting surface 22 of the reflecting member 20. As explained using FIG. 4, most of light emitted from the organic layer 120 (FIG. 4) is emitted from the second surface 104 of the substrate 100, and is not emitted from the first surface 102 of the substrate 100. In the example shown in FIG. 9, light emitted from the second surface 104 of the substrate 100 (light L1) is emitted toward a direction away from the reflecting surface 22 of the reflecting member 20 without being reflected by the reflecting surface 22 of the reflecting member 20.

The light-emitting device 10b includes a first surface 12 and a second surface 14. The second surface 14 is located on the opposite side of the first surface 12. The light-emitting device 10b can emit light from both of the first surface 12 and the second surface 14. The light-emitting device 10b is arranged so that the second surface 14 faces the reflecting surface 22 of the reflecting member 20. In the example shown in FIG. 9, light emitted from the first surface 12 of the light-emitting device 10b (light L2) is emitted toward a direction away from the reflecting surface 22 of the reflecting member 20 without being reflected by the reflecting surface 22 of the reflecting member 20. At least a portion of light emitted from the second surface 14 of the light-emitting device 10b (light L3) is reflected by the reflecting surface 22 of the reflecting member 20 and is transmitted through the light-transmitting unit 144 of the light-emitting device 10a.

Meanwhile, all of the light emitted from the second surface 14 of the light-emitting device 10b need not be reflected by the reflecting surface 22 of the reflecting member 20 and transmitted through the light-transmitting unit 144 of the light-emitting device 10a. For example, a portion of the light emitted from the second surface 14 of the light-emitting device 10b may be reflected by the reflecting surface 22 of the reflecting member 20 and emitted toward a direction away from the reflecting surface 22 of the reflecting member 20 without being transmitted through the light-emitting device 10a.

The orientation of at least a portion of light emitted front the second surface 14 of the light-emitting device 10b (light L3) may be set to be different from the orientation of light from the second surface 104 of the substrate 100 (light L1) by appropriately adjusting the angle formed between the portion of light and the reflecting surface 22 of the reflecting member 20. Thus, light having an orientation of one of the light L1 and the light L3 or light having both orientations of the light L1 and the light L3 can be generated from the second surface 104 of the substrate 100.

In the example shown in FIG. 9, the light-emitting device 10a and the light-emitting device 10b are in proximity of each other. Specifically, a portion of the light-emitting device 10a is overlapped by a portion of the light-emitting device 10b in the direction orthogonal to the first surface 12 or the second surface 14 of the light-emitting device 10b.

In the example shown in FIG. 9, the light-emitting device 10a is located closer to the reflecting surface 22 of the reflecting member 20 than the light-emitting device 10b.

Figure 10:
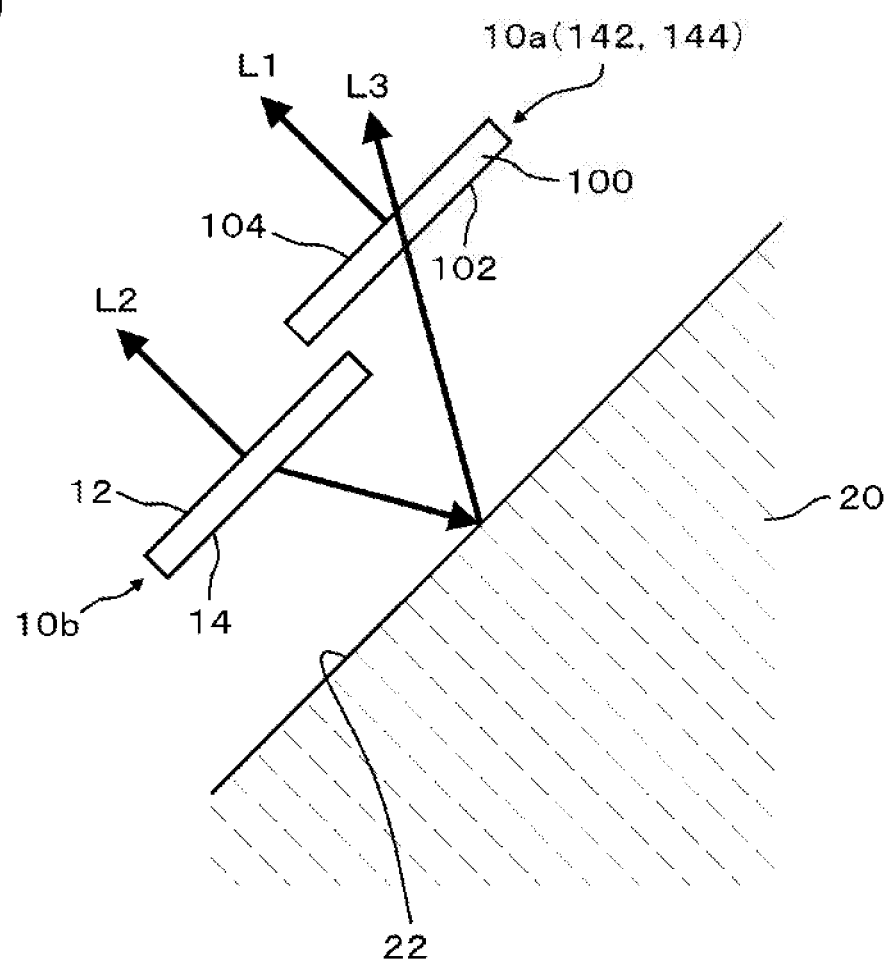
FIG. 10 is a diagram showing Modification Example 1 of FIG. 9.

FIG. 10 is a diagram showing Modification Example 1 of FIG. 9.

As shown in FIG. 10, the light-emitting device 10b may be located closer to the reflecting surface 22 of the reflecting member 20 than the light-emitting device 10a.

In the example shown in FIG. 10 also, the light-emitting device 10a and the light-emitting device 10b are in proximity of each other. Specifically, a portion of the light-emitting device 10a overlaps a portion of the light-emitting device 10b in the direction orthogonal to the first surface 12 or the second surface 14 of the light-emitting device 10b.

Figure 11:
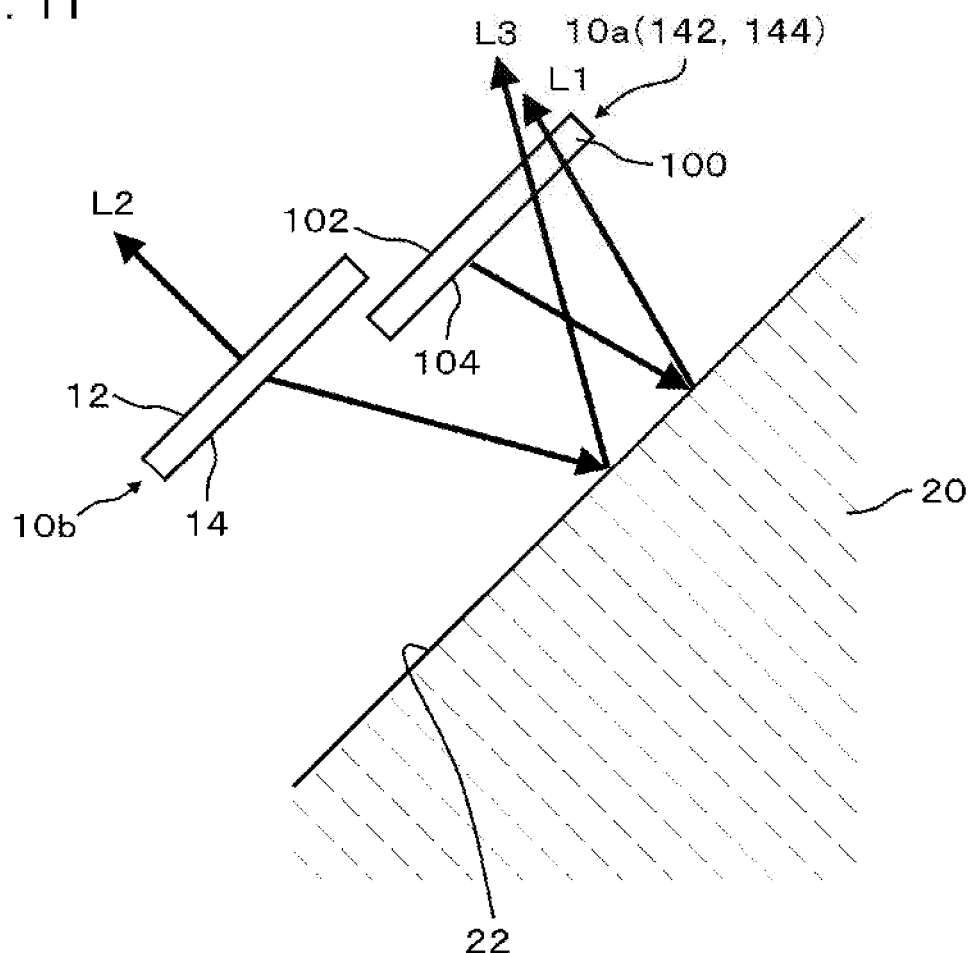
FIG. 11 is a diagram showing Modification Example 2 of FIG. 9.

FIG. 11 is a diagram showing Modification Example 2 of FIG. 9.

In the example shown in FIG. 11, the light-emitting device 10a is arranged so that the second surface 104 of the substrate 100 faces the reflecting surface 22 of the reflecting member 20. Similarly to the example shown in FIG. 9, most of the light emitted from the organic layer 120 (FIG. 4) is emitted from the second surface 104 of the substrate 100, and is not emitted from the first surface 102 of the substrate 100. In the example shown in FIG. 11, light emitted from the second surface 104 of the substrate 100 (light L1) is reflected by the reflecting surface 22 of the reflecting member 20 and is transmitted through the light-emitting device 10a.

In the example shown in FIG. 11, it is possible to make light emitted from the light-emitting device 10b and transmitted through the light-emitting device 10a (light L3) easier to see. Specifically, in the example shown in FIG. 11, light emitted from the light-emitting device 10a cannot be directly seen from the first surface 102 side of the substrate 100. Therefore, the light emitted from the light-emitting device 10b and transmitted through the light-emitting device 10a (light L3) becomes easier to see.

Figure 12:
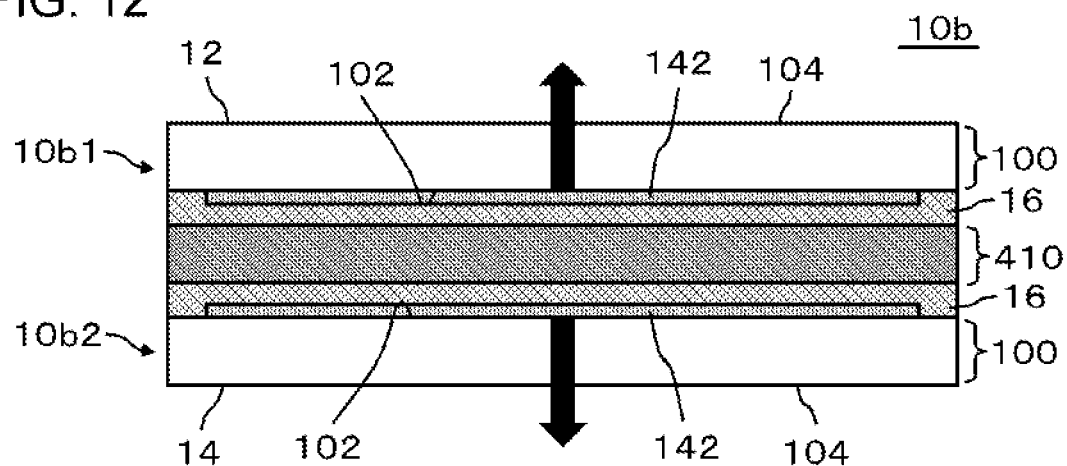
FIG. 12 is a diagram to explain Example 1 of the light-emitting device shown in FIG. 9.

FIG. 12 is a diagram to explain Example 1 of the light-emitting device 10b shown in FIG. 9.

The light-emitting device 10b includes a light-emitting member 10b1 (first light-emitting member) and a light-emitting member 10b2 (second light-emitting member). Each of the light-emitting member 10b1 and the light-emitting member 10b2 is provided with the substrate 100 and the light-emitting unit 142. The substrate 100 includes the first surface 102 and the second surface 104. The light-emitting unit 142 is located on the first surface 102 side of the substrate 100. The second surface 104 is located on the opposite side of the first surface 102.

The light-emitting device 10b can emit light from both of the first surface 12 and the second surface 14. Specifically, each of the light-emitting member 10b1 and the light-emitting member 10b2 can emit light from the second surface 104. In the example shown in FIG. 12, as shown with a black arrow, light, emitted from the light-emitting unit 142 is transmitted through the substrate 100 and emitted from the second surface 104 of the substrate 100. The light-emitting member 10b1 and the light-emitting member 10b2 are joined to a supporting member 410 (details of the supporting member 410 to be described later using FIGS. 22-25) through an adhesive layer 16 so that the first surface 102 of the light-emitting member 10b2 faces the first surface 102 of the light-emitting member 10b1. In this manner, the light-emitting device 10b can emit light from both of the first surface 12 and the second surface 14. That is, the second surface 104 of the light-emitting member 10b1 serves as the first surface 12 of the light-emitting device 10b, and the second surface 104 of the light-emitting member 10b2 serves as the second surface 14 of the light-emitting device 10b.

Figure 13:
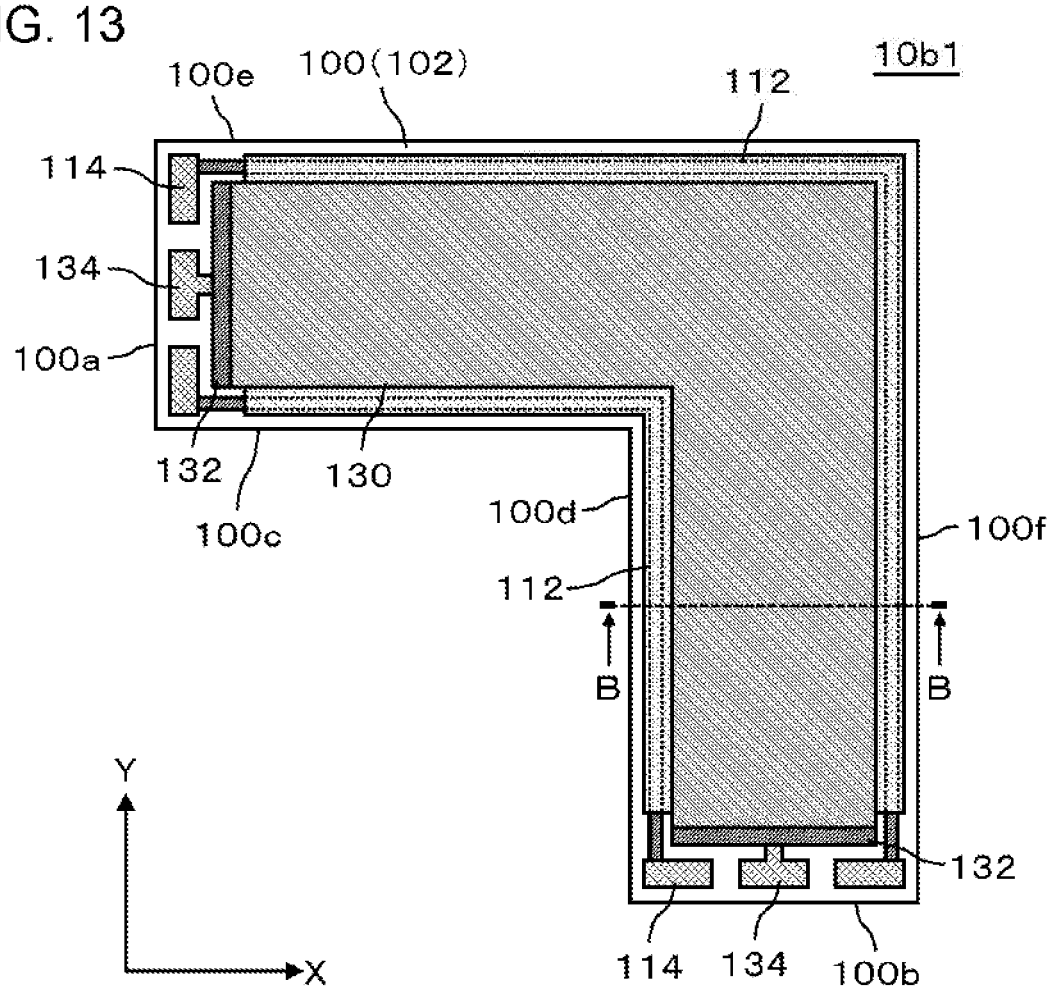
FIG. 13 is a plan view showing the light-emitting member shown in FIG. 12.
Figure 14:
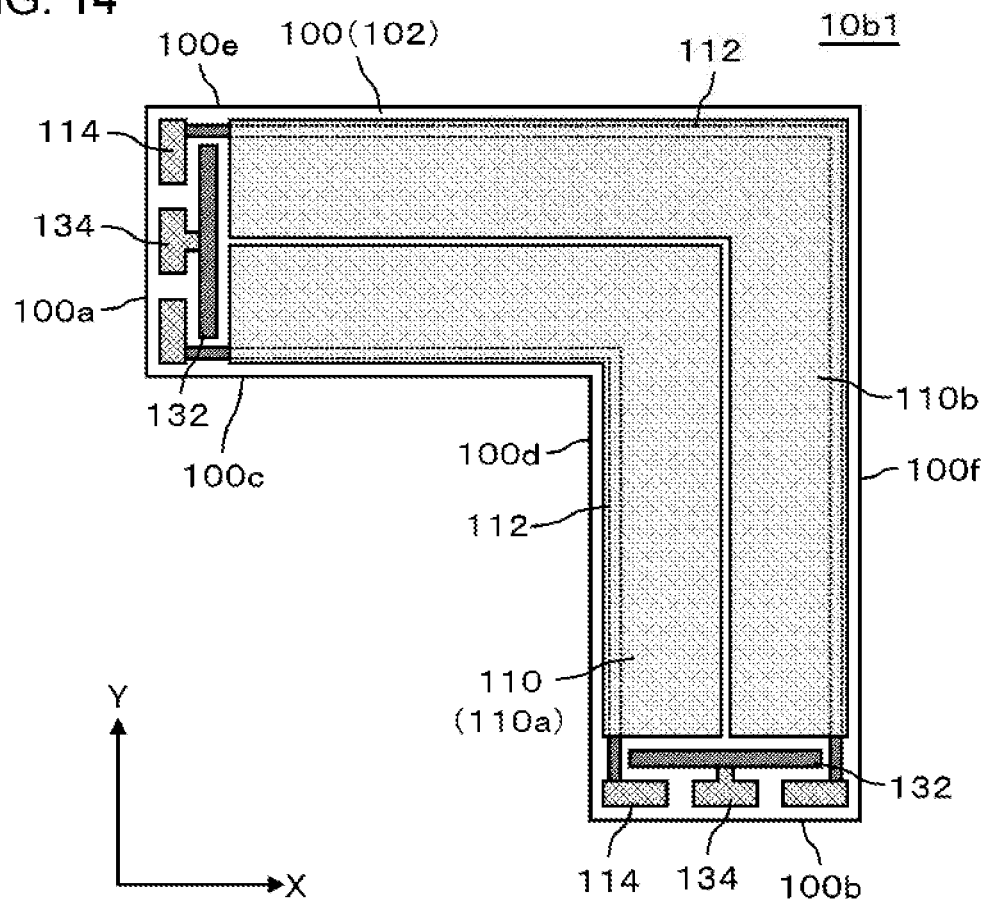
FIG. 14 is a diagram in which a second electrode is removed from FIG. 13.
Figure 15:
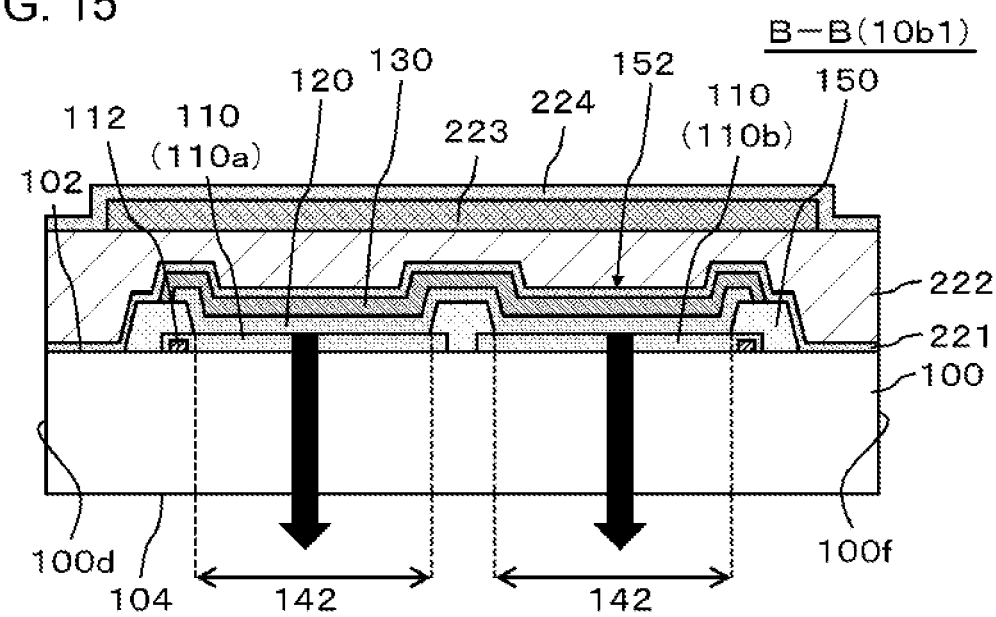
FIG. 15 is a cross-sectional view taken along line B-B of FIG. 13.

FIG. 13 is a plan view showing the light-emitting member 10b1 shown in FIG. 12. FIG. 14 is a diagram in which the second electrode 130 is removed from FIG. 13. FIG. 15 is a cross-sectional view taken along line B-B of FIG. 13. The light-emitting member 10b1 is the same as the light-emitting device 10a shown in FIGS. 2-4 except the following.

Details of the plan layout of the light-emitting member 10b1 is explained using FIGS. 13-14.

The second electrode 130 continuously extends from the side 100a to the side 100b, along the side 100c, the side 100d, the side 100e, and the side 100f. Further, the second electrode 130 continuously extends from the side 100c and the side 100d to the side 100e and the side 100f. That is, the second electrode 130 shown in FIG. 13, unlike the plurality of second electrodes 130 shown in FIG. 2, is not arranged in a striped pattern. Therefore, the light-emitting member 10b1, unlike the light-emitting device 10a, does not include the light-transmitting unit 144 (FIG. 4) and does not have light-transmitting properties.

Details of the cross-sectional structure of the light-emitting member 10b1 is explained using FIG. 15.

The insulating layer 150 defines each of two light-emitting units 142 by each of two openings 152. The first segment 110a of the first electrode 110 configures one of the two light-emitting units 142, and the second segment 110b of the first electrode 110 configures the other of the two light-emitting units 142. The organic layer 120 extends across the two light-emitting units 142. The second electrode 130 also extends across the two light-emitting units 142.

The light-emitting member 10b1 includes a covering layer 221, an adhesive layer 222, a desiccant 223, and a layer 224. The covering layer 221, the adhesive layer 222, the desiccant 223, and the layer 224 are laminated in order over the first surface 102 of the substrate 100.

The covering layer 221 is provided to shield a substance (for example, vapor or oxygen) which can deteriorates the light-emitting unit 142, particularly the organic layer 120. The covering layer 221 is formed by ALD, and includes an inorganic material having insulating properties.

The adhesive layer 222 is provided to adhere the desiccant 223.

The desiccant 223 is provided to protect the organic layer 120 from vapor. The desiccant 223 is adhered to the first surface 102 of the substrate 100 through the adhesive layer 222.

The layer 224 covers the desiccant 223. In one example, the layer 224 may be a metal layer (for example, an Al layer).

The structure to seal the light-emitting unit 142 of the light-emitting member 10b1 is not limited to the example shown in FIG. 15. As is clear from the explanations of the present embodiment, the light-emitting unit 142 may be sealed by a structure different from the structure shown in FIG. 15.

As shown in FIG. 15 with a black arrow, most of the light emitted from the organic layer 120 is emitted from the second surface 104 of the substrate 100, and is not emitted to the first surface 102 side of the substrate 100. Specifically, the substrate 100 and the first electrode 110 have light-transmitting properties, and the second electrode 130 has light shielding properties, particularly, light reflectivity. Therefore, light emitted from the organic layer 120 is reflected by the second electrode 130, transmitted through the first electrode 110 and the substrate 100, and emitted from the second surface 104 of the substrate 100, the light hardly transmitted through the second electrode 130.

The light-emitting member 10b2 (FIG. 12) also includes a configuration which is the same as the light-emitting member 10b1 shown in FIGS. 13-15.

Figure 16:
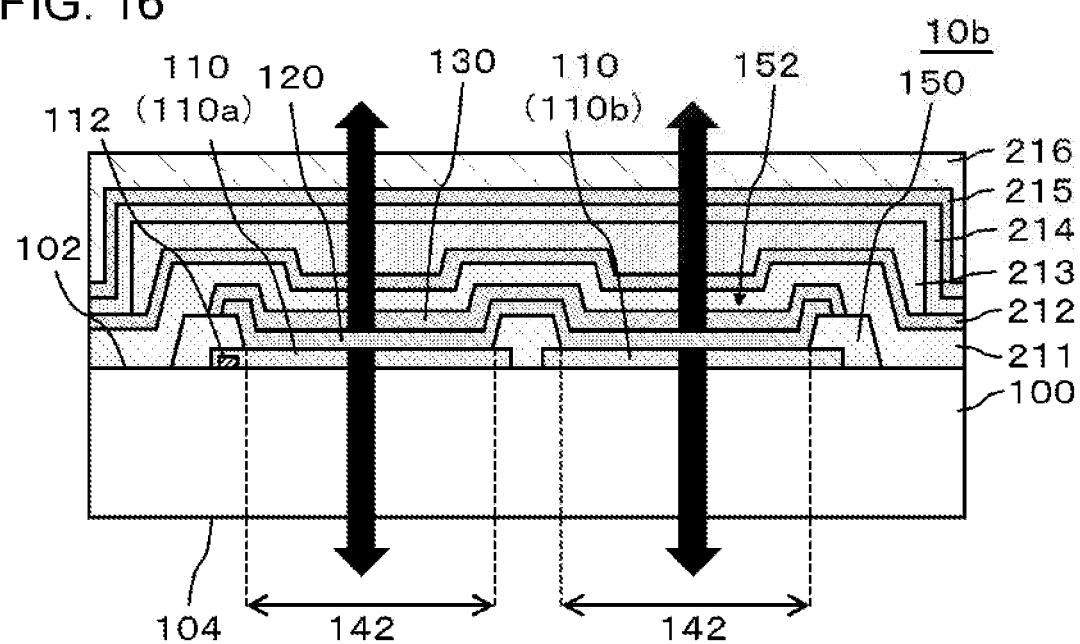
FIG. 16 is a diagram to explain Example 2 of the light-emitting device shown in FIG. 9.

FIG. 16 is a diagram to explain Example 2 of the light-emitting device 10b shown in FIG. 9. The light-emitting device 10b shown in FIG. 16 is the same as the light-emitting member 10b1 shown in FIG. 15 except the following.

As shown in FIG. 16 with a black arrow, approximately half of the light emitted from the organic layer 120 is emitted from the second surface 104 of the substrate 100, and approximately the other half of the light emitted from the organic layer 120 is emitted from the protective layer 216 (that is, the first surface 102 side of the substrate 100). Specifically, the substrate 100 and the first electrode 110 have light-transmitting properties, and the second electrode 130 also has light-transmitting properties. Therefore, light emitted from the organic layer 120 can be transmitted through not only the first electrode 110 and the substrate 100, but also through the second electrode 130. Therefore, approximately half of the light emitted from the organic layer 120 is emitted from the second surface 104 of the substrate 100, and approximately the other half of the light emitted from the organic layer 120 is emitted from the protective layer 216 (that is, the first surface 102 side of the substrate 100). That is, the second surface 104 of the substrate 100 serves as one of the first surface 12 and the second surface 14 of the light-emitting device 10b (FIG. 9), and the surface of the protective layer 216 is the other of the first surface 12 and the second surface 14 of the light-emitting device 10b (FIG. 9).

Similarly to the first electrode 110, the second electrode 130 includes a light-transmitting conductive material, and has light-transmitting properties. The light-transmitting conductive material is, for example, a metal oxide (for example, ITO, IZO, IWZO, ZnO) or IGZO, a carbon nanotube, an electroconductive polymer (for example, PEDOT/PSS) or a metal film having light-transmitting properties (for example, Ag), or an alloy film (for example, AgMg). The light-transmitting conductive material contained in the second electrode 130 may be the same as the light-transmitting conductive material contained in the first electrode 110, or may be different therefrom.

In the example shown in FIG. 16, the light-emitting device 10*b* includes a sealing structure (the layer 211, the covering layer 212, the intermediate layer 213, the layer 214, the covering layer 215, and the protective layer 216) which is the same as the sealing structure of the light-emitting device 10*a* shown in FIG. 4. Therefore, light emitted from the organic layer 120 can be transmitted through the sealing structure.

Figure 17:
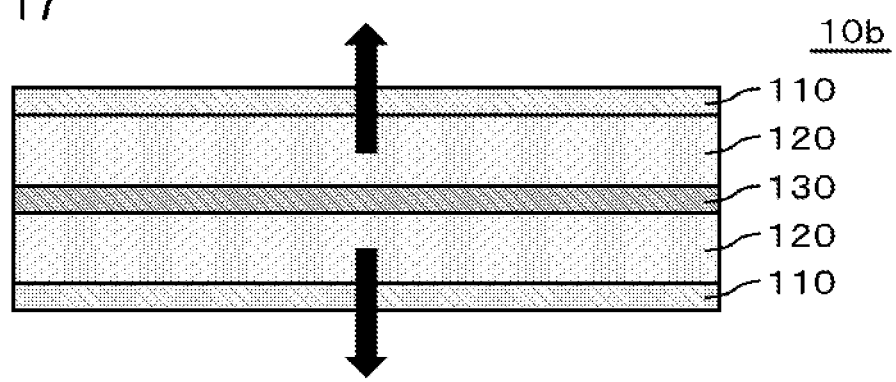
FIG. 17 is a diagram to explain Example 3 of the light-emitting device shown in FIG. 9.

FIG. 17 is a diagram to explain Example 3 of the light-emitting device 10*b* shown in FIG. 9.

In the example shown in FIG. 17, the light-emitting device 10*b* includes two first electrodes 110, two organic layers 120, and one second electrode 130. The first electrode 110 has light-transmitting properties, and the second electrode 130 has light shielding properties, specifically, light reflectivity. The two organic layers 120 are located on the opposite side of each other with the second electrode 130 therebetween. The two first electrodes 110 are located on the opposite side of each other with the second electrode 130 and the two organic layers 120 therebetween. That is, the second electrode 130 configures one light-emitting unit with a first electrode 110 and an organic layer 120 on one side of the second electrode 130, and configures another light-emitting unit with a first electrode 110 and an organic layer 120 on the other side of the second electrode 130. In other words, these two light-emitting units share the second electrode 130.

As shown with a black arrow in FIG. 17, light emitted from one organic layer 120 is transmitted through the first electrode 110 and emitted toward the opposite side of the second electrode 130, and light emitted from the other organic layer 120 is transmitted through the first electrode 110 and emitted toward the opposite side of the second electrode 130. In this manner, as shown in FIG. 9, the light-emitting device 10*b* can emit light from both surfaces of the light-emitting device 10*b* (first surface 12 and second surface 14 of FIG. 9).

Figure 18:
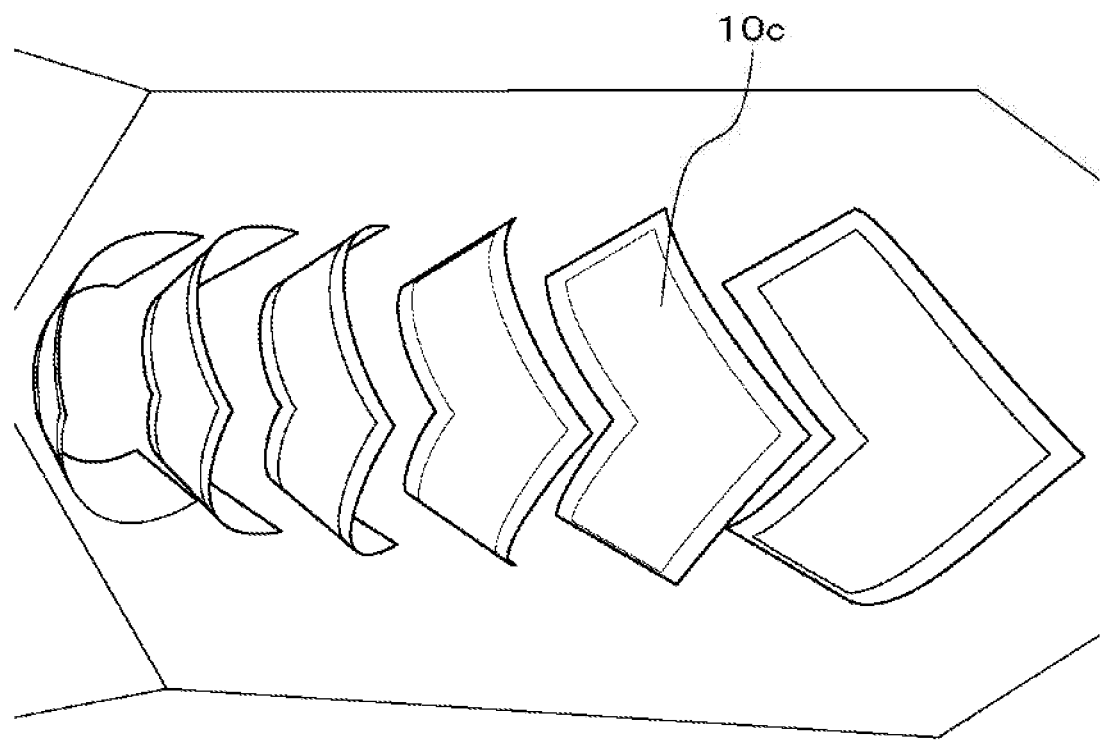
FIG. 18 is a diagram to explain an example of an arrangement of the plurality of light-emitting devices (light-emitting module) shown in FIG. 1.
Figure 19:
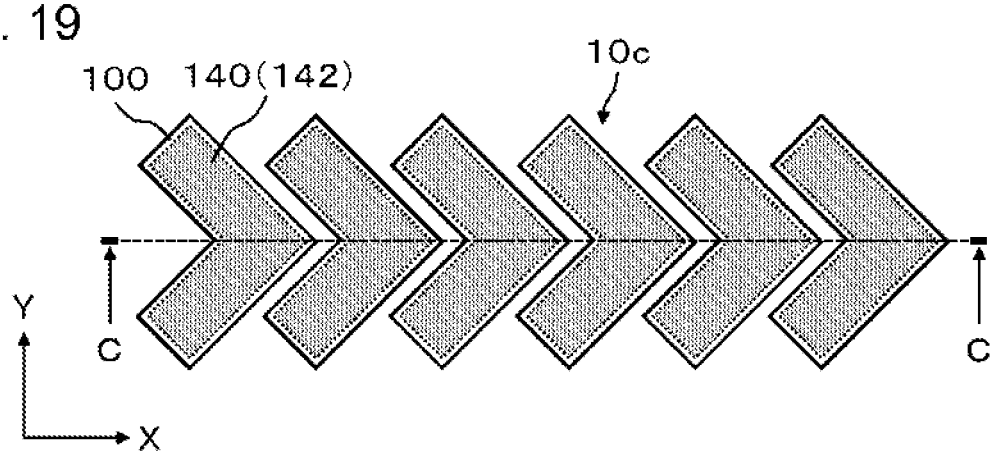
FIG. 19 is a diagram of the plurality of light-emitting devices shown in FIG. 18 when viewed from a second surface side of the substrate.
Figure 20:
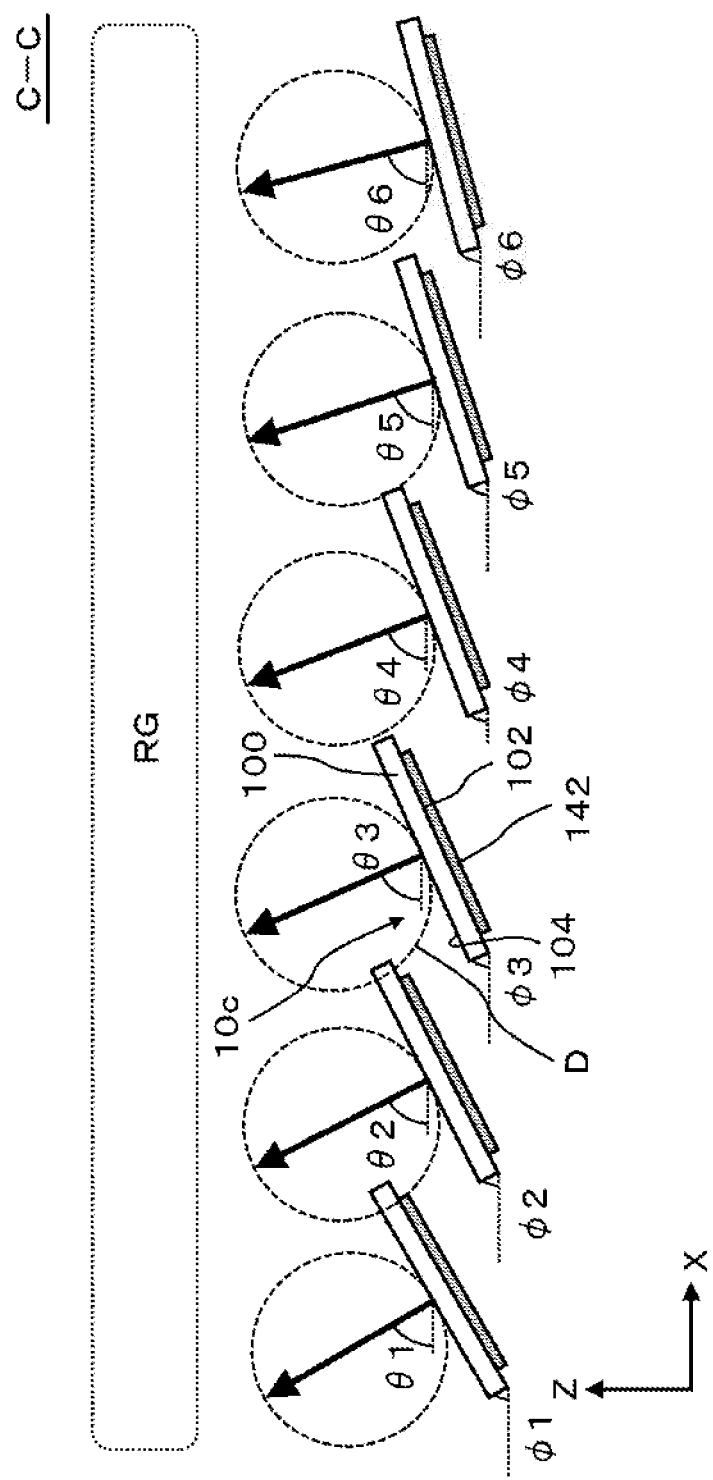
FIG. 20 is a cross-sectional view taken along line C-C of FIG. 19.

FIG. 18 is a diagram to explain an example of the arrangement of a plurality of the light-emitting devices 10*c* (light-emitting module) shown in FIG. 1. FIG. 19 is a diagram of the plurality of light-emitting devices 10*c* shown in FIG. 18 when viewed from the second surface 104 side of the substrate 100. FIG. 20 is a cross-sectional view taken along line C-C of FIG. 19.

A summary of the light-emitting module is explained using FIG. 20. The light-emitting module includes the plurality of light-emitting devices 10*c*. The plurality of light-emitting devices 10*c* are aligned in the first direction (X direction of FIG. 20). The plurality of light-emitting devices 10*c* emit light toward a region RG (that is, a region located on one side of the plurality of light-emitting devices 10*c*). The plurality of light-emitting devices 10*c* have peaks (the peaks are shown with arrows in FIG. 20) in directions which are different from each other in a light distribution D (that is, a light distribution on a cross-section (surface ZX of FIG. 20) along both of the first direction (X direction of FIG. 20) and the second direction (Z direction of FIG. 20: the light emission direction of the plurality of light-emitting devices 10*c*)).

According to the above-mentioned configuration, light with a high luminous intensity can be emitted toward a region facing the plurality of light-emitting devices 10*c* (particularly, the region RG in FIG. 20) over a wide angle. Specifically, in the above-mentioned configuration, the plurality of light-emitting devices 10*c* have peaks in directions which are different from each other in the light distribution D. Therefore, the peak in the light distribution D in each light-emitting device 10*c* is not localized only in a specific direction, and the peaks can be dispersed over a wide angle. Therefore, light with a high luminous intensity can be emitted toward a region facing the plurality of light-emitting devices 10*c* over a wide angle.

Each light-emitting device 10*c* includes a light-emitting region 140 (light-emitting unit 142). The light-emitting device 10*c* includes a configuration which is the same as, for example, the light-emitting member 10*b*1 as shown in FIGS. 12-15. The wavelength of light emitted from the light-emitting device 10*c* may be different from or substantially the same as the wavelength of light emitted from the light-emitting member 10*b*1.

Details of the light-emitting module is explained using FIG. 18.

The plurality of light-emitting devices 10*c* are convexly curved toward the region RG (FIG. 20) when viewed from a direction along the above-mentioned cross section (surface ZX of FIG. 20). The plurality of light-emitting devices 10*c* have substantially the same shape, and specifically, are curved at a substantially equivalent curvature. As is clear from the explanation of the present embodiment, the plurality of light-emitting devices 10*c* may be curved at curvatures which are different from each other.

Details of the light-emitting module is explained using FIG. 19.

The plurality of light-emitting devices 10*c* have substantially the same shape. Therefore, the area of the light-emitting region 140 (light-emitting unit 142) of each of the plurality of light-emitting devices 10*c* is substantially the same.

Details of the light-emitting device 10*c* is explained using FIG. 20.

In the example shown in FIG. 20, the light distribution D of each light-emitting device 10*c* is a Lambertian distribution. In this example, the direction of the peak of the light distribution D is the normal direction of the second surface 104 of the light-emitting device 10*c*. In another example, the light distribution B of each light-emitting device 10*c* may be different from the Lambertian distribution.

In the example shown in FIG. 20, angles ($\theta 1$, $\theta 2$, $\theta 3$, $\theta 4$, $\theta 5$, and $\theta 6$) in directions (directions of black arrows in FIG. 20) of peaks with respect to the first direction (X direction of FIG. 20) vary depending on the light-emitting device 10*c*. Specifically, in FIG. 20, the angles become larger ($\theta 1 < \theta 2 < \theta 3 < \theta 4 < \theta 5 < \theta 6$) from the light-emitting device 10*c* at the left side toward the light-emitting device 10*c* at the right side. That is, the plurality of light-emitting devices 10*c* include a first light-emitting device (light-emitting device 10*c*), a second light-emitting device (light-emitting device 10*c*), and a third light-emitting device (light-emitting device 10*c*) in order along the first direction (X direction of FIG. 20), and the above-mentioned angles become larger or smaller in the order of the first light-emitting device, the second light-emitting device, and the third light-emitting device. According to such a configuration, the light distribution of light emitted toward the region (region RG in FIG. 20) facing the plurality of light-emitting devices 10*c* can be inhibited from varying.

The direction of the peak of the light distribution D in each light-emitting device 10 can be adjusted by various methods. In the example shown in FIG. 20, the direction of the peak of the light distribution D is adjusted by the normal direction of the second surface 104 of the light-emitting device 10c, that is, by the installation angle of the light-emitting device 10c. In more detail, the inclination of the end of each light-emitting device 10c (φ1-φ6 in FIG. 20) with respect to the first direction (X direction of FIG. 20) varies depending on the light-emitting device 10c, and in the example shown in FIG. 20, φ1<φ2<φ3<φ4<φ5<φ6.

Figure 21:
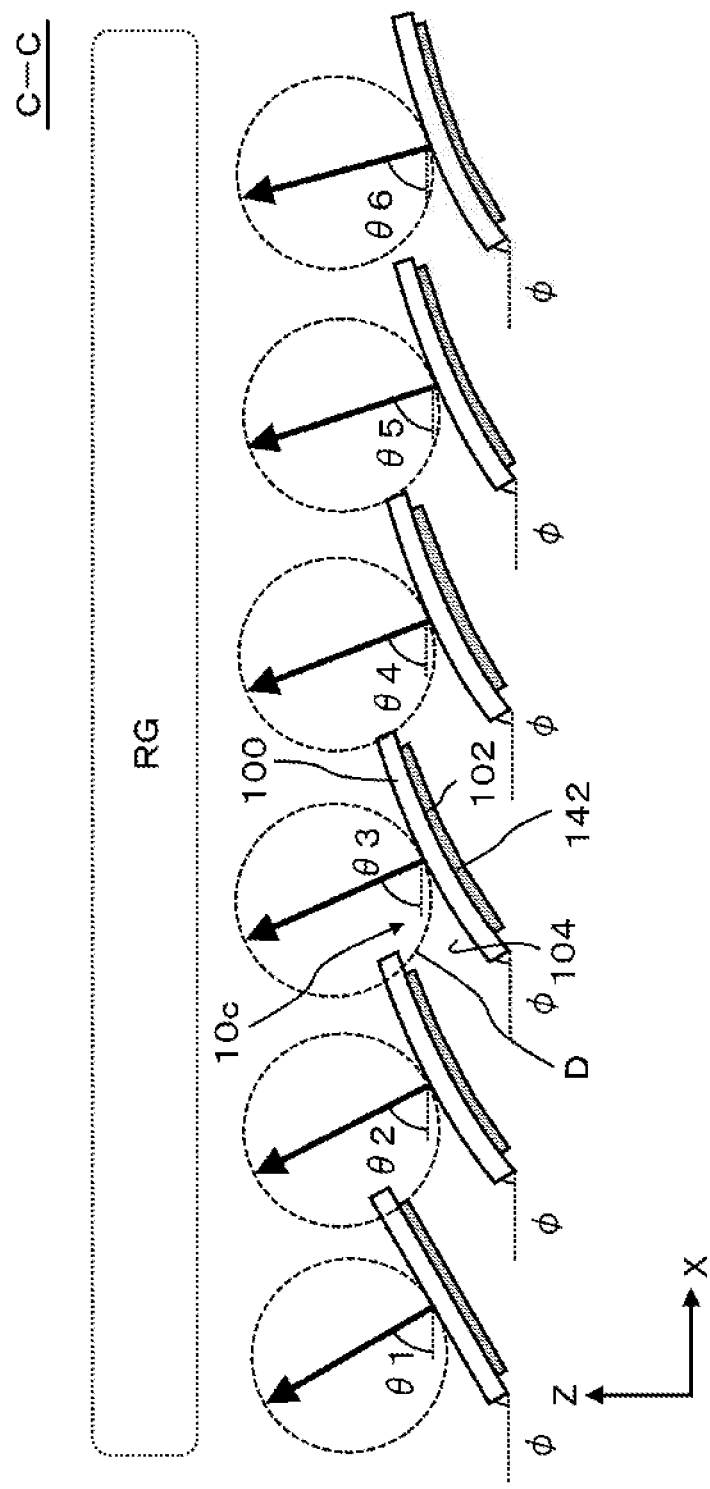
FIG. 21 is a diagram showing a modification example of FIG. 20.

FIG. 21 is a diagram showing a modification example of FIG. 20.

In the example shown in FIG. 21, the inclination of the end of each light-emitting device 10c with respect to the first direction (X direction of FIG. 20) is constant (φ). Meanwhile, each light-emitting device 10c curves at a curvature different from another light-emitting device 10c so that the direction of the peak of the light distribution D varies depending on the light-emitting device 10c. In the example shown in FIG. 21 also, the direction of the peak of the light distribution D in each light-emitting device 10 can be adjusted.

Figure 22:
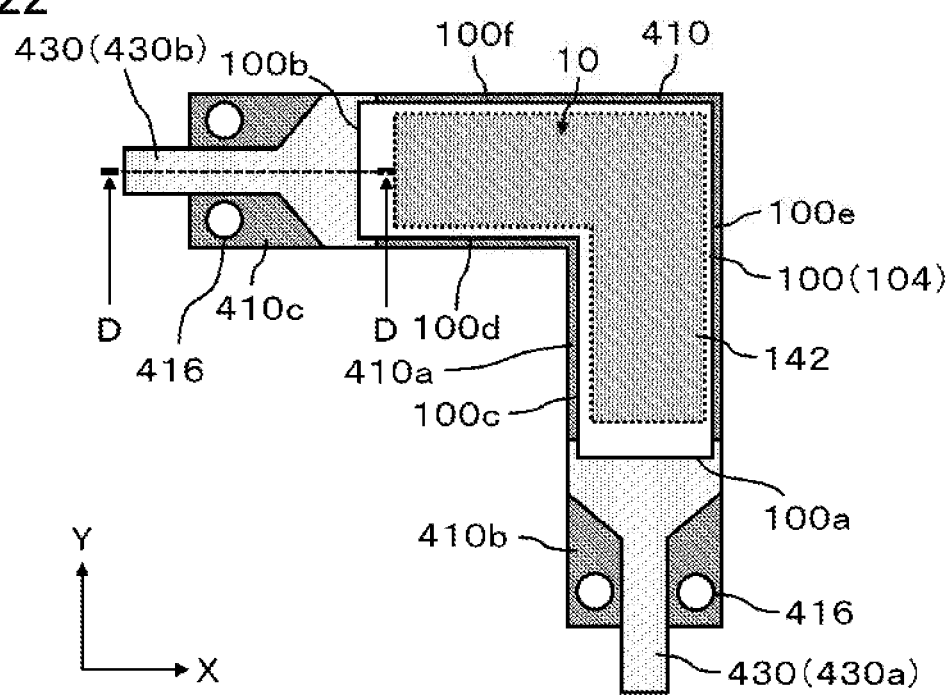
FIG. 22 is a diagram to explain a method to install a light-emitting device on a supporting member.
Figure 23:
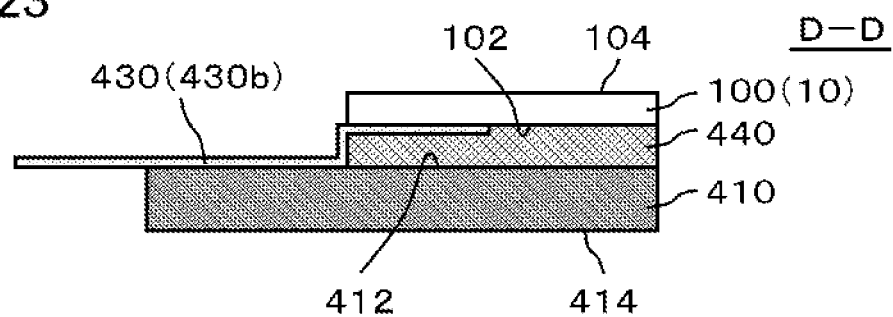
FIG. 23 is a cross-sectional view taken along line D-D of FIG. 22.
Figure 24:
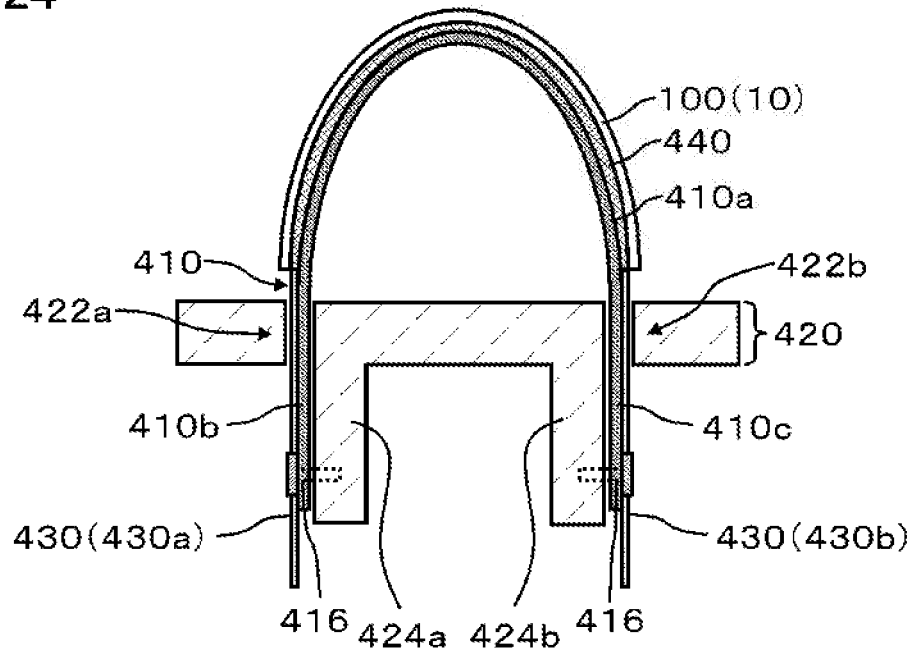
FIG. 24 is a diagram to explain a method to install the supporting member (light-emitting module) shown in FIG. 22.

FIG. 22 is a diagram to explain a method to install the light-emitting device 10 on the supporting member 410. FIG. 23 is a cross-sectional view taken along line D-D of FIG. 22. FIG. 24 is a diagram to explain a method to install the supporting member 410 (light-emitting module) shown in FIG. 22.

A summary of the light-emitting module is explained using FIG. 24.

The light-emitting module includes the light-emitting device 10, the supporting member 410, and a shielding member 420. The supporting member 410 includes a first region 410a and a second region 410b. The second region 410b is different from the first region 410a. The light-emitting device 10 is installed in the first region 410a of the supporting member 410. The shielding member 420 includes a first opening 422a. The first region 410a and the second region 410b of the supporting member 410 are located on the opposite side of each other with the first opening 422a therebetween. Specifically, the first region 410a and the second region 410b of the supporting member 410 pass through the first opening 422a from the first region 410a to the second region 410b to be located on the opposite side of each other with the shielding member 420 therebetween. The second region 410b of the supporting member 410 is fixed to a member 424a (that is, a member which is located on the same side as the second region 410b with respect to the shielding member 420).

According to the above-mentioned configuration, it is possible to make the structure on which the light-emitting device 10 is installed less noticeable. Specifically, in the above-mentioned configuration, the supporting member 410 passes through the first opening 422a from the first region 410a to the second region 410b so that the first region 410a and the second region 410b are located on the opposite side of each other with the shielding member 420 therebetween, and the second region 410b of the supporting member 410 is fixed to the member 424a. The structure on which the light-emitting device 10 is installed (for example, the member 424a and surroundings thereof) can be provided on the opposite side of the light-emitting device 10 with the shielding member 420 therebetween, and is hardly noticeable from the side of the light-emitting device 10 due to the shielding member 420. Therefore, it is possible to make the structure on which the light-emitting device 10 is installed less noticeable.

In the example shown in FIG. 24, the light-emitting module includes a first wiring member 430a. The first wiring member 430a is connected to the light-emitting device 10, and extends from the first region 410a to the outside of the supporting member 410 via the second region 410b. The first wiring member 430a passes through the first opening 422a of the shielding member 420.

According to the above-mentioned configuration, it is possible to make the structure to supply electrical power to the light-emitting device 10 less noticeable. Specifically, in the above-mentioned configuration, the first wiring member 430a passes through the first opening 422a of the shielding member 420. Electrical power can be supplied to the light-emitting device 10 via the first wiring member 430a. The structure to supply electrical power (for example, a circuit connected to the first wiring member 430a) can foe provided on the opposite side of the light-emitting device 10 with the shielding member 420 therebetween, and is hardly noticeable from the side of the light-emitting device 10 due to the shielding member 420. Therefore, it is possible to make the structure to supply electrical power to the light-emitting device 10 less noticeable.

In addition, according to the above-mentioned configuration, the supporting member 410 and the first wiring member 430a can pass through the shielding member 420 via a common opening (that is, the first opening 422a). Therefore, the number of the openings formed in the shielding member 420 can be reduced.

In another example, the supporting member 410 and the first, wiring member 430a may pass through the shielding member 420 via different openings. In this example also, it is possible to make less noticeable the structure on which the light-emitting device 10 is installed and the structure to supply electrical power to the light-emitting device 10.

In the example shown in FIG. 24, the supporting member 410 includes a third region 410c. The third region 410c is on the opposite side of the second region 410b with the first region 410a therebetween. The shielding member 420 includes a second opening 422b. The first region 410a and the third region 410c of the supporting member 410 are located on the opposite side of each other with the second opening 422b therebetween. Specifically, the first region 410a and the third region 410c of the supporting member 410 pass through the second opening 422b from the first region 410a to the third region 410c to be located on the opposite side of each other with the shielding member 420 therebetween. The third region 410c of the supporting member 410 is fixed to a member 424b (that, is, a member which is located on the same side as the third region 410c with respect to the shielding member 420).

According to the above-mentioned configuration, as is the case with the above-mentioned reasons, it is possible to make the structure (for example, the member 424b and surroundings thereof) on which the light-emitting device 10 to be installed less noticeable.

In addition, according to the above-mentioned configuration, both sides of the supporting member 410 can be fixed. Therefore, the supporting member 410 can be stably installed. Particularly as shown in FIG. 24, the first region 410a of the supporting member 410 can be curved from the first opening 422a to the second opening 422b.

In the example shown in FIG. 24, the light-emitting module includes a second wiring member 430b. The second wiring member 430b is connected to the light-emitting device 10, and extends from the first region 410a to the outside of the supporting member 410 via the third region 410c. The second wiring member 430b passes through the second opening 422b of the shielding member 420.

According to the above-mentioned configuration, as is the case with the above-mentioned reason, it is possible to make the structure (for example, a circuit connected to the second wiring member 430b) to supply electrical power to the light-emitting device 10 less noticeable.

In addition, according to the above-mentioned configuration, the supporting member 410 and the second wiring member 430b can pass through the shielding member 420 via a common opening (that is, the second opening 422b). Therefore, the number of the openings formed in the shielding member 420 can be reduced.

In another example, the supporting member 410 and the second wiring member 430b may pass through the shielding member 420 via different openings. In this example also, it is possible to make less noticeable the structure on which the light-emitting device 10 is installed and the structure to supply electrical power to the light-emitting device 10.

Details of the light-emitting module is explained using FIG. 22.

The light-emitting device 10 shown in FIG. 22 includes a configuration which is the same as the light-emitting device 10a shown in FIGS. 2-4 or the light-emitting member 10b1 shown in FIGS. 13-15.

The supporting member 410 is L-shaped. Specifically, the supporting member 410 includes a portion extending from the first region 410a to the second region 410b in the first direction (Y direction of FIG. 22), and a portion extending from the first region 410a to the third region 410c in the second direction (X direction of FIG. 22) which intersects the first direction. The second region 410b protrudes further outward than the side 100a of the light-emitting device 10, and the third region 410c protrudes further outward than the side 100b of the light-emitting device 10.

A plurality of wiring members 430 are connected to the light-emitting device 10. The wiring members 430 may be, for example, flexible printed circuits (FPC). In the example shown in FIG. 22, the first wiring member 430a (wiring member 430) is connected to the side 100a of the light-emitting device 10, and the second wiring member 430b (wiring member 430) is connected to the side 100b of the light-emitting device 10. The wiring member 430 is connected to the terminal 114 and the terminal 134 (for example, FIG. 2, FIG. 3, FIG. 13, and FIG. 14). Therefore, the wiring member 430 can be electrically connected to the first electrode 110 and the second electrode 130 (for example, FIG. 4 and FIG. 15).

In the example shown in FIG. 22, openings 416 are formed in both sides of the supporting member 410 with a portion of the first wiring member 430a therebetween, and the openings 416 are formed in both sides of the supporting member 410 with a portion of the second wiring member 430b therebetween. The openings 416 are provided so as to fix the supporting member 410. Particularly in the later described example shown in FIG. 24, the supporting member 410 is fixed by screwing a screw in the member 424a (member 424b) via the openings 416.

Details of the light-emitting module is explained using FIG. 23.

The supporting member 410 includes a first surface 412 and a second surface 414. The second surface 414 is on the opposite side of the first surface 412. The light-emitting device 10 is installed on the supporting member 410 via an adhesive layer 440 so that the first surface 102 of the substrate 100 faces the first surface 412 of the supporting member 410. A portion of the wiring member 430 is embedded in the adhesive layer 440.

The supporting member 410 is formed of a metal (for example, Al). In this case, the supporting member 410 functions as a soaking plate. In another example, the supporting member 410 may be formed of a light-transmitting resin (for example, acrylic) and may fix the light-emitting device 10 outside the light-emitting region. In this case, by making the adhesive layer 440 a light-transmitting material, even when the light-emitting device 10a is supported, it is possible to inhibit light-transmitting properties from becoming impaired.

Details of the light-emitting module is explained using FIG. 24.

In the example shown in FIG. 24, the second region 410b of the supporting member 410 is fixed to the member 424a in a direction from the second region 410b side to the third region 410c side of the supporting member 410 by a fixing member (specifically, a screw), and the third region 410c of the supporting member 410 is fixed to the member 424b in a direction from the third region 410c side to the second region 410b side of the supporting member 410 by a fixing member (specifically, a screw). Due to the curve of the first region 410a of the supporting member 410, an internal stress (restoring force) is generated to deform the supporting member 410 in a direction separating the second region 410b and the third region 410c from each other on the supporting member 410. By the above-mentioned fixing member, deformation of the supporting member 410 by an internal stress can be inhibited.

Figure 25:
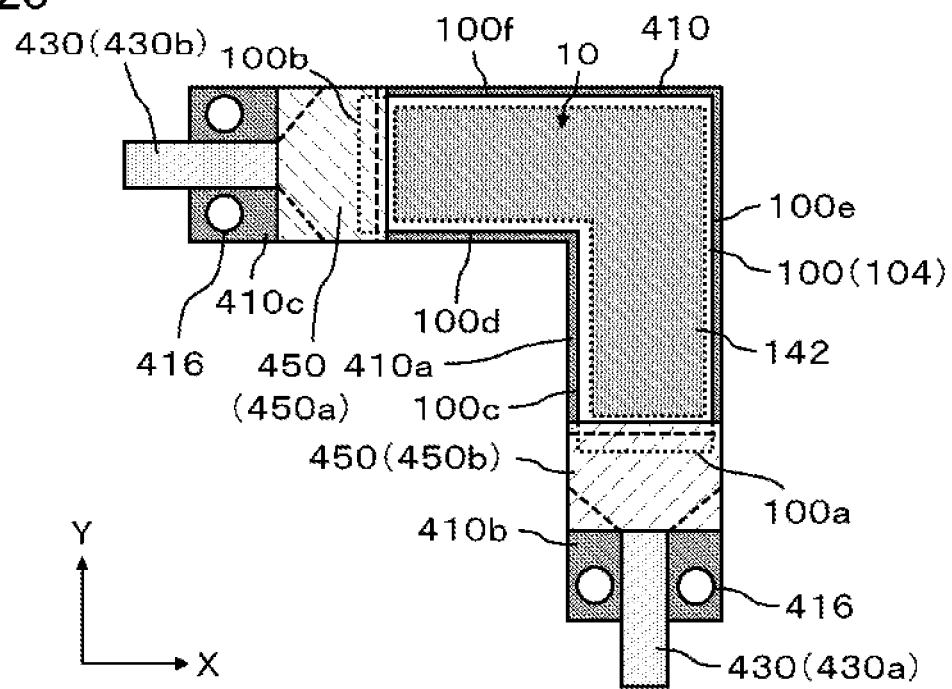
FIG. 25 is a diagram showing a modification example of FIG. 22.

FIG. 25 is a diagram showing a modification example of FIG. 22.

The light-emitting module includes a plurality of shielding films 450 (first shielding film 450a and second shielding film 450b). The first shielding film 450a covers a portion of the first wiring member 430a. This portion is located on the same side as the first region 410a with respect to the shielding member 420 in FIG. 24. Therefore, even when the portion of the first wiring member 430a is exposed on the light-emitting device 10 side in FIG. 24, the portion can be hidden by the first shielding film 450a. The second shielding film 450b covers a portion of the second wiring member 430b. This portion is located on the same side as the first region 410a with respect to the shielding member 420 in FIG. 24. Therefore, even when the portion of second wiring member 430b is exposed on the light-emitting device 10 side in FIG. 24, the portion can be hidden by the second shielding film 450b.

The shielding film 450 favorably has an appearance (for example, color or glossiness) which is similar to the appearance (for example, color or glossiness) of a member in the surroundings of the shielding film 450 to hide the wiring member 430. For example, in a case where the second electrode 130 of the light-emitting device 10 (for example, FIG. 4 and FIG. 15) is conspicuous, the shielding film 450 may have an appearance which is similar to appearance (for example, silver) of the second electrode 130 of the light-emitting device 10.

As described above, according to the present embodiment, a light-emitting device and the light-emitting module having a new structure are provided.

As described above, although the embodiment and examples of the present invention have been set forth with reference to the accompanying drawings, they are merely illustrative of the present invention, and various configurations other than those stated above can be adopted.

This application claims priority from Japanese Patent Application No. 2017-203218, filed Oct. 20, 2017, the disclosure of which is incorporated by reference in its entirety.

The invention claimed is:

1. A light-emitting device comprising:
   a substrate comprising a first surface, a first side extending in a first direction, a second side extending in the first direction and located opposite to the first side in a second direction intersecting the first direction, a third side intersecting the first side and extending in the second direction, a first internal angle greater than 180° defined by the first side and the third side, a fourth side intersecting the second side and extending in the second direction and located opposite to the third side in the first direction, and a second internal angle less than 180° defined by the second side and the fourth side;
   a first electrode located on the first surface of the substrate;
   an organic layer comprising a light-emitting layer and located on the first electrode;
   a first group of second electrodes located on the organic layer and extending in the first direction, the first group of second electrodes being located between the first side and the second side; and
   a second group of second electrodes located on the organic layer and extending in the second direction, the second group of second electrodes being located between the third side and the fourth side,
   wherein the first surface comprises a first region in which the first group of second electrodes are located, a second region in which the second group of second electrodes are located, and a third region between the first region and the second region in which no second electrode is located.

2. The light-emitting device according to claim 1, further comprising:
   a first terminal connected to the first group of second electrodes; and
   a second terminal connected to the second group of second electrodes,
   wherein the first terminal is located on an opposite side of the third region with the first group of second electrodes located between the first terminal and the third region, and
   wherein the second terminal is located on an opposite side of the third region with the second group of second electrodes located between the second terminal and the third region.

3. The light-emitting device according to claim 2, wherein a distance from the second terminal to the third region is substantially equal to a distance from the first terminal to the third region.

4. The light-emitting device according to claim 1, wherein the first group of second electrodes and the second group of second electrodes comprise a pair of second electrodes substantially symmetrically arranged with respect to the third region, and
   wherein each of a length and a width of one of the pair of second electrodes are substantially equal to each of a length and a width of an other of the pair of second electrodes.

5. The light-emitting device according to claim 1, wherein the first electrode comprises a plurality of segments separated from each other, and
   wherein the plurality of segments are aligned along a direction intersecting an extending direction of the first group of second electrodes and the second group of second electrodes.

6. The light-emitting device according to claim 1, wherein the first electrode continuously extends from the first region to the second region via the third region.

7. The light-emitting device according to claim 1, further comprising:
   a light-transmitting unit between second electrodes adjacent to each other out of the first group of second electrodes; and
   a light-transmitting unit between second electrodes adjacent to each other out of the second group second electrodes.

8. The light-emitting device according to claim 1, wherein the first electrode comprises a first portion extending in the first direction and a second portion extending in the second direction,
   wherein the organic layer comprises a third portion located on the first portion and a fourth portion located on the second portion,
   wherein the first group of second electrodes are located on the third portion, and
   wherein the second group of second electrodes are located on the fourth portion.

9. The light-emitting device according to claim 8, further comprising:
   a third terminal connected to the first portion of the first electrode; and
   a fourth terminal connected to the second portion of the first electrode,
   wherein the third terminal is located on an opposite side of the third region with the first portion of the first electrode located between the third terminal and the third region, and
   wherein the fourth terminal is located on an opposite side of the third region with the second portion of the first electrode located between the fourth terminal and the third region.

10. The light-emitting device according to claim 1, wherein the first electrode has a light-transmitting property,
    wherein the first group of second electrodes have a light-shielding property, and
    wherein the second group of second electrodes have a light-shielding property.

11. A light-emitting device comprising:
    a substrate comprising a first surface, a first side extending in a first direction, a second side extending in the first direction and located opposite to the first side in a second direction intersecting the first direction, a third side intersecting the first side and extending in the second direction, a first internal angle greater than 180° defined by the first side and the third side, a fourth side intersecting the second side and extending in the second direction and located opposite to the third side in the first direction, and a second internal angle less than 180° defined by the second side and the fourth side;
    a first electrode located on the first surface of the substrate;
    an organic layer comprising a light-emitting layer and located on the first electrode;
    a first group of second electrodes located on the organic layer and extending in the first direction, the first group of second electrodes being located between the first side and the second side; and a second group of second electrodes located on the organic layer and extending in the second direction, the second group of second electrodes being located between the third side and the fourth side, wherein at least one of the first group of second electrodes does not intersect any of the second group of second electrodes.

12. The light-emitting device according to claim 11, wherein none of the first group of second electrodes intersects any of the second group of second electrodes.

13. The light-emitting device according to claim 11, wherein the first electrode comprises a first portion extending in the first direction and a second portion extending in the second direction, wherein the organic layer comprises a third portion located on the first portion and a fourth portion located on the second portion, wherein the first group of second electrodes are located on the third portion, and wherein the second group of second electrodes are located on the fourth portion.

14. The light-emitting device according to claim 13, further comprising:

a terminal connected to the first portion of the first electrode; and an other terminal connected to the second portion of the first electrode, wherein the terminal is located on an opposite side of a region with the first portion of the first electrode located between the terminal and the region, and wherein the other terminal is located on an opposite side of the region with the second portion of the first electrode located between the other terminal and the region.

15. The light-emitting device according to claim 11, wherein the first electrode has a light-transmitting property, wherein the first group of second electrodes have a light-shielding property, and wherein the second group of second electrodes have a light-shielding property.

16. A light-emitting device comprising:

a substrate comprising a first surface, a first side extending in a first direction, a second side extending in the first direction and located opposite to the first side in a second direction intersecting the first direction, a third side intersecting the first side and extending in the second direction away from the second side, and a fourth side intersecting the second side and extending in the second direction and located opposite to the third side in the first direction;

a first electrode located on the first surface of a substrate;

an organic layer comprising a light-emitting layer and located on the first electrode;

a first group of second electrodes located on the organic layer and extending in the first direction, the first group of second electrodes being located between the first side and the second side; and a second group of second electrodes located on the organic layer and extending in the second direction, the second group of second electrode being located between the third side and the fourth side, wherein the first surface comprises a first region in which the first group of second electrodes are located, a second region in which the second group of second electrodes are located, and a third region between the first region and the second region in which no second electrode is located, wherein the first electrode comprises a first portion extending in the first direction and a second portion extending in the second direction, wherein the organic layer comprises a third portion located on the first portion and a fourth portion located on the second portion, wherein the first group of second electrodes are located on the third portion, wherein the second group of second electrodes are located on the fourth portion, wherein the light-emitting device further comprises:

a third terminal connected to the first portion of the first electrode; and a fourth terminal connected to the second portion of the first electrode, wherein the third terminal is located on an opposite side of the third region with the first portion of the first electrode located between the third terminal and the third region, and wherein the fourth terminal is located on an opposite side of the third region with the second portion of the first electrode located between the fourth terminal and the third region.

17. The light-emitting device according to claim 16, further comprising:

a first terminal connected to the first group of second electrodes; and a second terminal connected to the second group of second electrodes, wherein the first terminal is located on an opposite side of the third region with the first group of second electrodes therebetween, and wherein the second terminal is located on an opposite side of the third region with the second group of second electrodes therebetween.

18. The light-emitting device according to claim 16, wherein the first group of second electrodes and the second group of second electrodes comprise a pair of second electrodes substantially symmetrically arranged with respect to the third region, and wherein each of a length and a width of one of the pair of second electrodes are substantially equal to each of a length and a width of an other of the pair of second electrodes.

* * * * *